(12) United States Patent
Ueda et al.

(10) Patent No.: US 8,173,447 B2
(45) Date of Patent: May 8, 2012

(54) MAGNETORESISTIVE ELEMENT AND MAGNETIC MEMORY

(75) Inventors: Tomomasa Ueda, Yokohama (JP);
Hisanori Aikawa, Yokohama (JP);
Masatoshi Yoshikawa, Yokohama (JP);
Naoharu Shimomura, Sagamihara (JP);
Masahiko Nakayama, Fuchu (JP);
Sumio Ikegawa, Musashino (JP); Keiji Hosotani, Sagamihara (JP); Makoto Nagamine, Komae (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/851,275

(22) Filed: Aug. 5, 2010

(65) Prior Publication Data

US 2010/0315864 A1 Dec. 16, 2010

Related U.S. Application Data

(62) Division of application No. 12/014,522, filed on Jan. 15, 2008, now Pat. No. 7,894,246.

(30) Foreign Application Priority Data

Jan. 26, 2007 (JP) ................................. 2007-016930

(51) Int. Cl.
*H01L 21/00* (2006.01)
*H01L 2/336* (2006.01)
*H01L 21/20* (2006.01)
*H01L 21/469* (2006.01)

(52) U.S. Cl. ............ 438/3; 438/263; 438/264; 438/396; 438/768; 257/E21.28; 257/E21.665

(58) Field of Classification Search ............. 257/E21.28, 257/E21.665
See application file for complete search history.

(56) References Cited

U.S. PATENT DOCUMENTS 6,256,223 B1 7/2001 Sun
7,950,135 B2 * 5/2011 Kagami et al. ............. 29/603.11
(Continued)

FOREIGN PATENT DOCUMENTS

JP 2005-32878 2/2005
(Continued)

OTHER PUBLICATIONS

J.C. Slonczewski, "Current-driven excitation of magnetic multilayers", Journal of Magnetism and Magnetic Materials, vol. 159, 1996, pp. L1-L7.

(Continued)

*Primary Examiner* — Mohsen Ahmadi
(74) *Attorney, Agent, or Firm* — Oblon, Spivak, McClelland, Maier & Neustadt, L.L.P.

(57) ABSTRACT

A magnetoresistive element includes: a magnetization free layer having a first plane and a second plane located on the opposite side from the first plane, and having a variable magnetization direction; a magnetization pinned layer provided on the first plane side of the magnetization free layer, and having a pinned magnetization direction; a first tunnel barrier layer provided between the magnetization free layer and the magnetization pinned layer; a second tunnel barrier layer provided on the second plane of the magnetization free layer; and a non-magnetic layer provided on a plane on the opposite side of the second tunnel barrier layer from the magnetization free layer. The magnetization direction of the magnetization free layer is variable by applying current between the magnetization pinned layer and the non-magnetic layer, and a resistance ratio between the first tunnel barrier layer and the second tunnel barrier layer is in a range of 1:0.25 to 1:4.

5 Claims, 22 Drawing Sheets

U.S. PATENT DOCUMENTS

| | | | |
|---|---|---|---|
| 2005/0024930 A1* | 2/2005 | Yoda et al. | 365/158 |
| 2005/0141148 A1* | 6/2005 | Aikawa et al. | 360/324.11 |
| 2008/0299679 A1* | 12/2008 | Zhao et al. | 438/3 |
| 2008/0316657 A1* | 12/2008 | Zhang et al. | 360/324.11 |

FOREIGN PATENT DOCUMENTS

| | | |
|---|---|---|
| JP | 2006-165059 | 6/2006 |
| JP | 2006-190838 | 7/2006 |

OTHER PUBLICATIONS

L. Berger, "Emission of spin waves by a magnetic multilayer traversed by a current", Physical Review B, vol. 54, No. 13, Oct. 1, 1996, pp. 9353-9358.

* cited by examiner

MAGNETORESISTIVE ELEMENT AND MAGNETIC MEMORY

CROSS-REFERENCE TO RELATED APPLICATION

This application is a division of and claims the benefit of priority under 35 U.S.C. §120 from U.S. Ser. No. 12/014,522 filed Jan. 15, 2008, and claims the benefit of priority under U.S.C. §119 from Japanese Patent Application No. 2007-16930 filed Jan. 26, 2007, the entire contents of each of which are incorporated herein by reference.

BACKGROUND OF THE INVENTION

1. Field of the Invention

The present invention relates to a magnetoresistive element and a magnetic memory.

2. Related Art

In recent years, many solid-state memories for recording information based on novel principles have been suggested. Among those solid-state memories, attention has been drawn to magnetoresistive random access memories (MRAM) as solid-state magnetic memories that utilize the tunneling magnetoresistive effect. The MRAMs are characterized by storing data according to the magnetization state of each MTJ (Magnetic Tunnel Junction) element.

In a MRAM that performs writing by inverting the magnetization direction of the storage layer of each MTJ element in the magnetic field caused by a current flowing through a wiring line provided in the vicinity of each MTJ element, the coercive force Hc of each MTJ element in principle becomes larger as the MTJ element is made smaller in size. Therefore, as the size of each MTJ element is reduced, it is necessary to strengthen the magnetic field induced by the current flowing through the wiring line. As a result, it is difficult to produce high-density memories.

To overcome this problem, a MRAM that utilizes a method for writing by inverting the magnetization direction of the storage layer of each MTJ element through a spin momentum transfer (SMT) has been suggested (see U.S. Pat. No. 6,256,223, C. Slonczewski, "Current-driven excitation of magnetic multilayers", JOURNAL OF MAGNETISM AND MAGNETIC MATERIALS, VOLUME 159, 1996, pp. L1-L7, and L. Berger, "Emission of spin waves by a magnetic multilayer traversed by a current", PHYSICAL REVIEW B, VOLUME 54, NUMBER 13, 1996, pp. 9353-9358).

In the magnetization reversal through a spin momentum transfer (hereinafter referred to as the spin injection), the current Ic required for the magnetization reversal is determined by the magnetic anisotropic energy (KuV) of the MTJ element. Accordingly, if the area of the MTJ element is reduced, the injection current Ic required for the magnetization reversal through the spin injection can be reduced. Compared with the above mentioned method for writing by utilizing the magnetic field induced by a current, the write current becomes smaller as the size of the MTJ element becomes smaller. Accordingly, excellent scalability can be expected.

However, the spin injection efficiency of MTJ elements today is not particularly high, and the current IC required for a magnetization reversal is expected to become lower.

When the MTJ elements are used in a high-density memory, the memory structure is strongly expected to have a simple structure and require a simple manufacturing process, and the current is expected to become lower.

SUMMARY OF THE INVENTION

The present invention has been made in view of these circumstances, and an object thereof is to provide a magnetoresistive element that can further reduce the reversed current at the time of a magnetization reversal, and a magnetic memory that includes the magnetoresistive element.

A magnetoresistive element according to a first aspect of the present invention includes: a magnetization free layer having a first plane and a second plane located on the opposite side from the first plane, and having a variable magnetization direction; a magnetization pinned layer provided on the first plane side of the magnetization free layer, and having a pinned magnetization direction; a first tunnel barrier layer provided between the magnetization free layer and the magnetization pinned layer; a second tunnel barrier layer provided on the second plane of the magnetization free layer; and a non-magnetic layer provided on a plane on the opposite side of the second tunnel barrier layer from the magnetization free layer, the magnetization direction of the magnetization free layer being variable by applying current between the magnetization pinned layer and the non-magnetic layer, a resistance ratio between the first tunnel barrier layer and the second tunnel barrier layer being in a range of 1:0.25 to 1:4.

A magnetoresistive element according to a second aspect of the present invention includes: a magnetization free layer having a first plane and a second plane located on the opposite side from the first plane, and having a variable magnetization direction; a magnetization pinned layer provided on the first plane side of the magnetization free layer, and having a pinned magnetization direction; a first tunnel barrier layer provided between the magnetization free layer and the magnetization pinned layer; a second tunnel barrier layer provided on the second plane of the magnetization free layer; and a non-magnetic layer provided on a plane on the opposite side of the second tunnel barrier layer from the magnetization free layer, the magnetization direction of the magnetization free layer being variable by applying current between the magnetization pinned layer and the non-magnetic layer, a difference in film thickness between the second tunnel barrier layer and the first tunnel barrier layer being 0.14 nm or smaller, when the first tunnel barrier layer and the second tunnel barrier layer are made of the same material and have tunnel junctions having the same areas as each other.

A magnetic memory according to a third aspect of the present invention includes: a magnetoresistive element according to any one of the first and second aspects; a first wiring line connected to one end of the magnetoresistive element; and a second wiring line connected to the other end of the magnetoresistive element.

DETAILED DESCRIPTION OF THE INVENTION

First Embodiment

Before a magnetoresistive element according to a first embodiment of the present invention is described, the course of events for achieving the magnetoresistive element according to the first embodiment will be described below.

Figure 2:
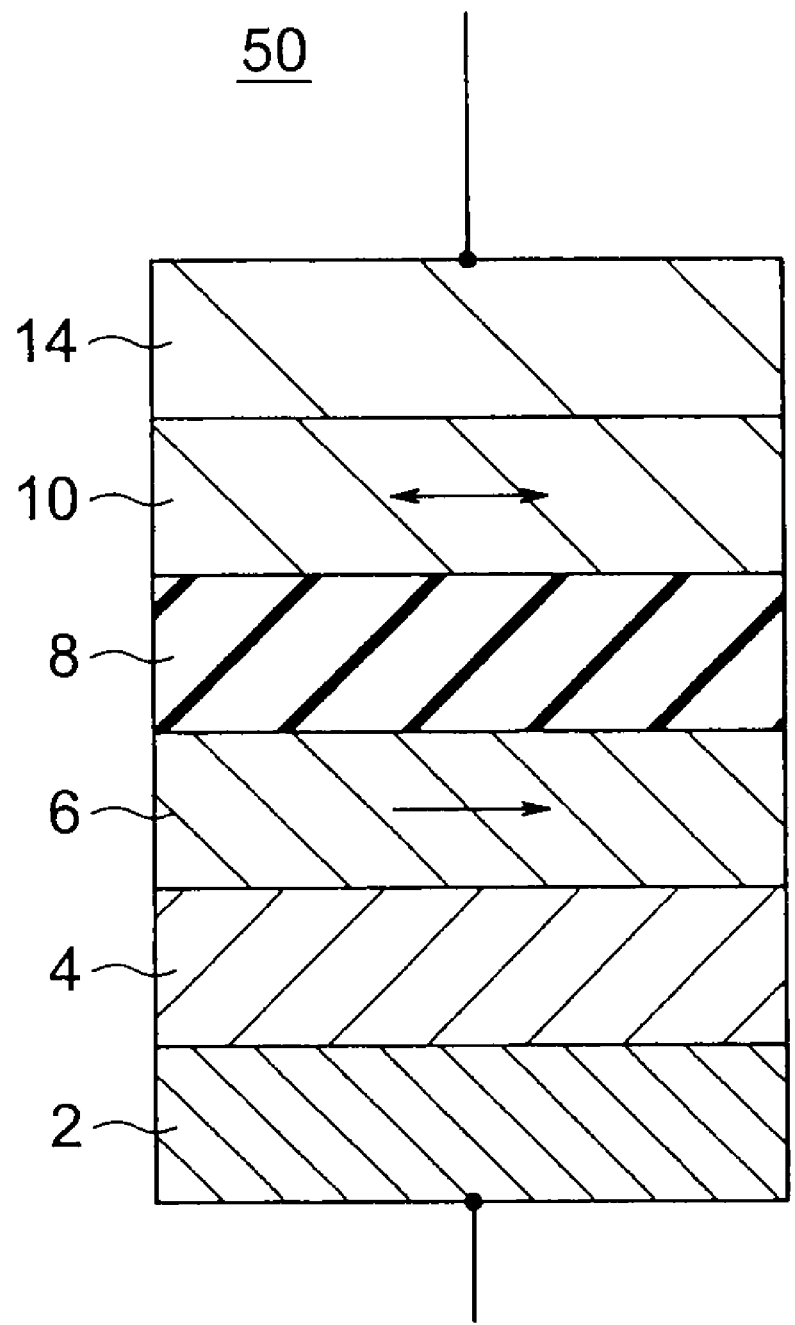
FIG. 2 is a cross-sectional view of a first magnetoresistive element as a first reference example.

First, as a first reference example, the inventors of the present invention produced a first magnetoresistive element 50 shown in FIG. 2. This magnetoresistive element 50 includes: a lower electrode 2; an antiferromagnetic layer 4 that is formed on the lower electrode 2, has a film thickness of 20 nm, and is made of PtMn; a magnetization pinned layer 6 that is formed on the antiferromagnetic layer 4 and has a stacked structure consisting of a CoFe layer having a film thickness of 2 nm, a Ru layer having a film thickness of 0.6 nm, and a CoFe layer having a film thickness of 2 nm; a tunnel barrier layer 8 that is formed on the magnetization pinned layer 6, has a film thickness of 1 nm, and is made of MgO; a magnetization free layer (storage layer) 10 that is formed on the tunnel barrier layer 8, has a film thickness of 2 nm, and is made of CoFe; a cap layer (not shown) that is formed on the magnetization free layer 10, has a film thickness of 5 nm, and is made of Ta; and an upper electrode 14 that is formed on the cap layer. The antiferromagnetic layer 4 pins the magnetization direction of the magnetization pinned layer 6. In the first magnetoresistive element 50 shown in FIG. 2, a reversed current obtained when a current is applied from the bottom toward the top or when electrons are caused to flow from the magnetization free layer toward the magnetization pinned layer is normally high.

Figure 3:
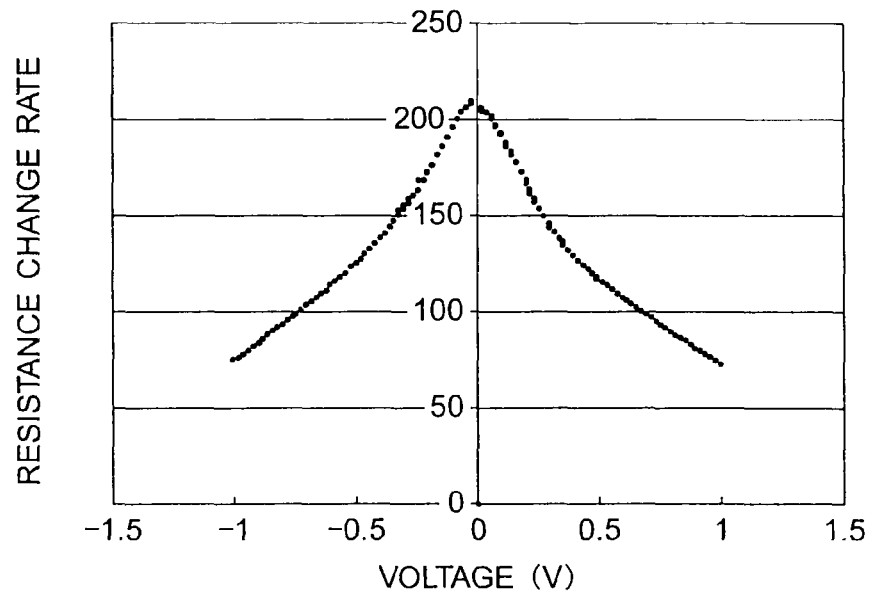
FIG. 3 shows the dependence of the MR of the first magnetoresistive element on the bias.
Figure 4:
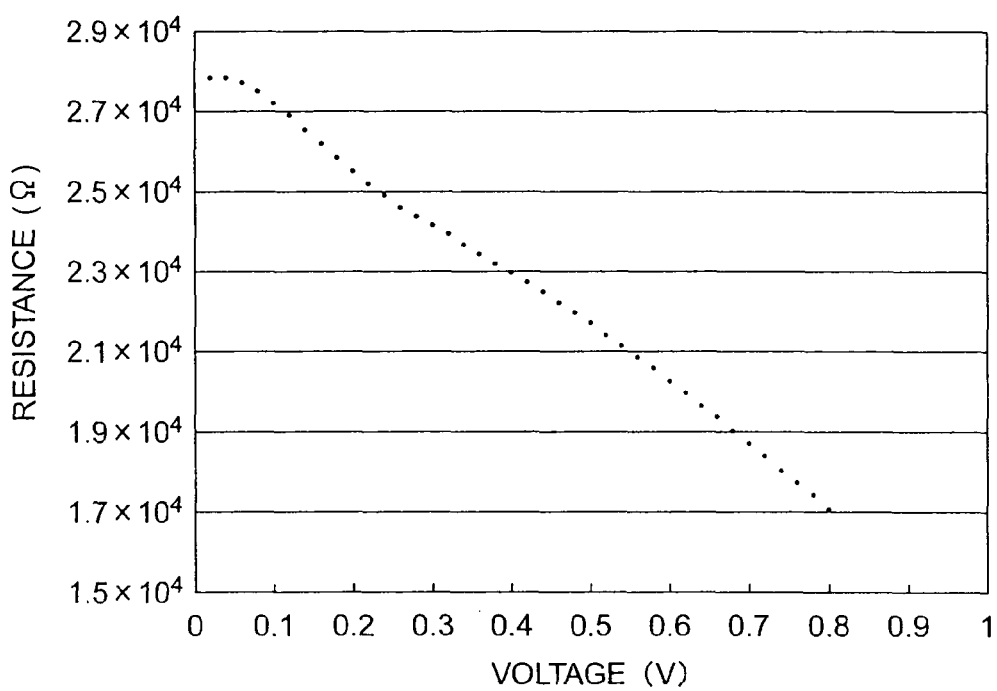
FIG. 4 shows the dependence of the resistance of the first magnetoresistive element on applied voltage.

FIG. 3 shows the dependence of the magnetoresistance ratio MR on the applied voltage and FIG. 4 shows the dependence of the resistance R on the applied voltage in a case where the magnetization direction of the magnetization pinned layer 6 of the magnetoresistive element 50 is the opposite from the magnetization direction of the magnetization free layer 10 or where the magnetoresistive element 50 is in an antiparallel (AP) state. The applied voltage is a positive voltage when a current is caused to flow from the upper electrode 14 toward the lower electrode 2, and is a negative voltage when a current is caused to flow from the lower electrode 2 to the upper electrode 14. As can be seen from FIG. 3, the magnetoresistance ratio MR dramatically decreases, as the absolute value of the applied voltage increases from 0 V. This is because the resistance in the AP state decreases from 0 V due to the applied voltage, as shown in FIG. 4.

Figure 5:
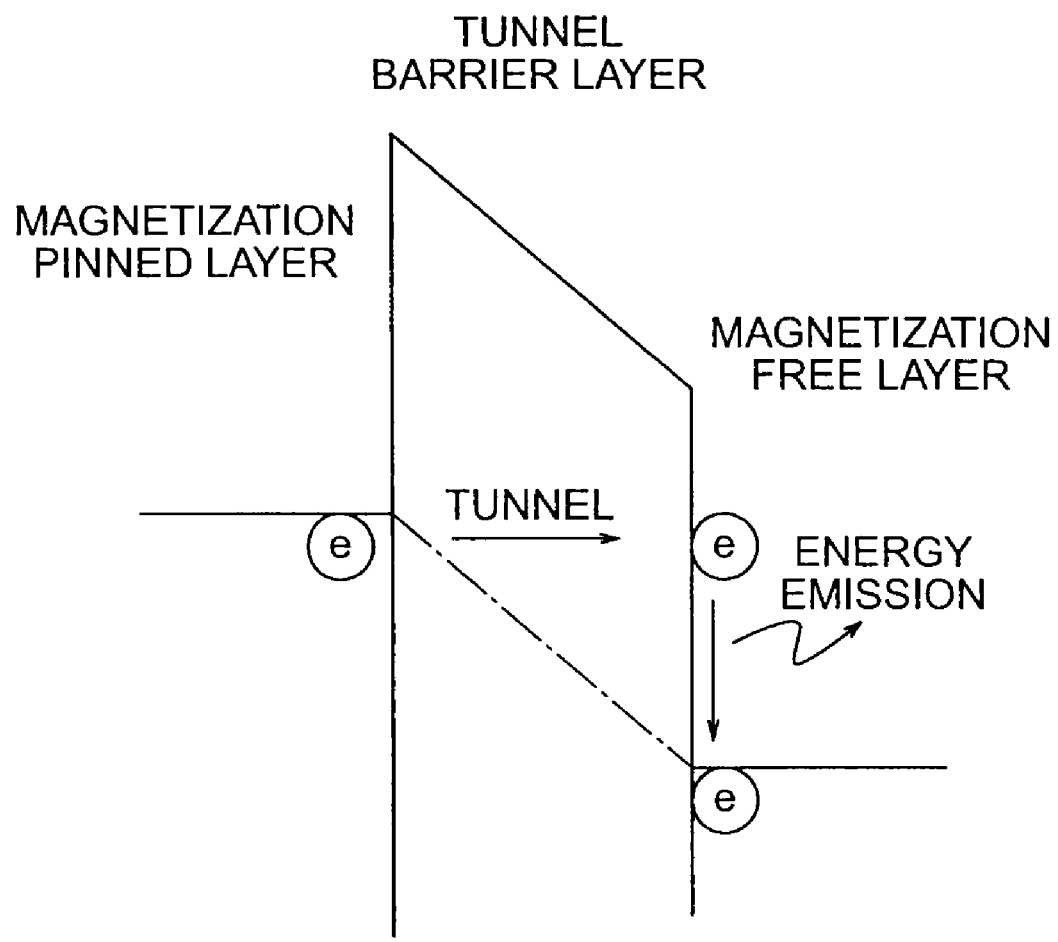
FIG. 5 is an energy band chart for explaining an operation of the first magnetoresistive element.
Figure 6:
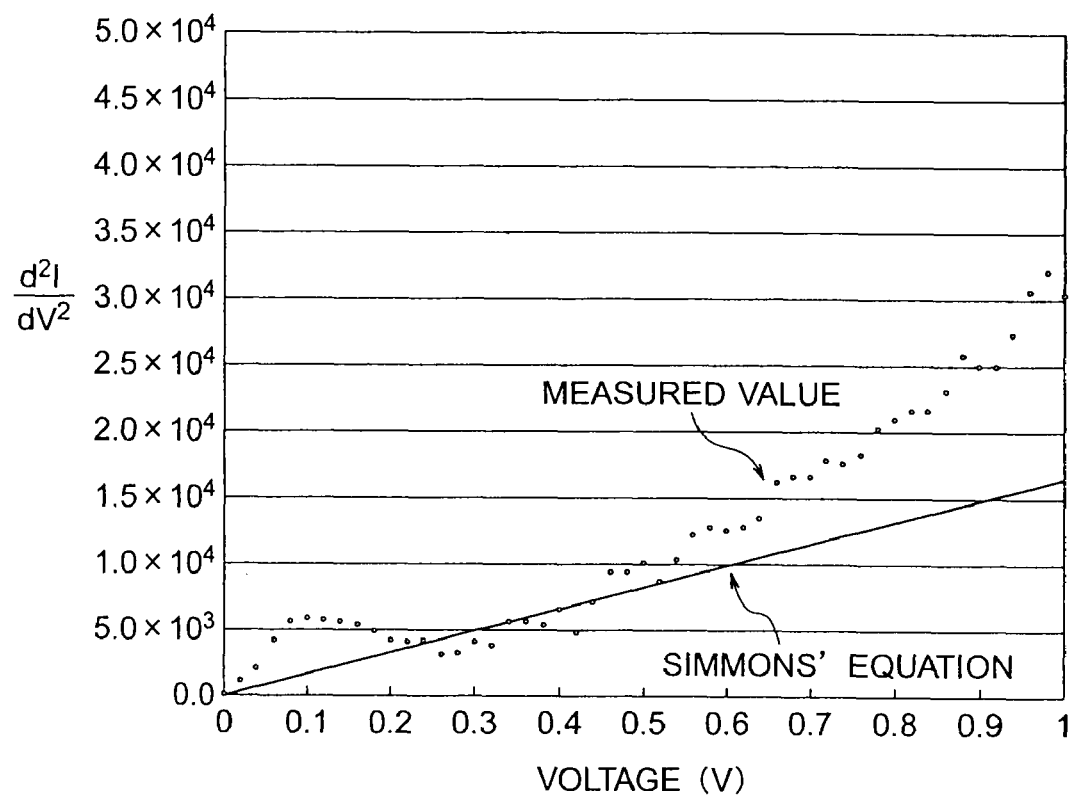
FIG. 6 shows the dependence of the second differential coefficient of current value of the first magnetoresistive element on the applied voltage.

The intense study made by the inventors of the present invention shows that the decrease of the resistance value due to the voltage application in the AP state is caused in the following manner. After electrons from a magnetization pinned layer pass through the tunnel barrier layer as shown in FIG. 5, the electrons generate energy in the magnetization free layer as the transmission destination, and the energy cause disturbance in the magnetization free layer. As a result, the magnetization direction is disturbed, and the resistance value becomes smaller. FIG. 6 is a graph, with the ordinate axis showing the value obtained by differentiating the current I twice ($d^2I/dV^2$), and the abscissa axis showing the voltage V. The solid line in FIG. 6 shows the value obtained according to the Simmons' equation. The Simmons' equation is obtained from the I-V characteristics of a device having a tunnel barrier layer sandwiched by two metal electrodes. Compared with the characteristics determined by the Simmons equation, it is found that the magnetoresistive element 50 shown in FIG. 2 has the maximum point in the neighborhood of 0.08 V. This indicates that the disturbance becomes larger until the voltage reaches 0.08 V, increasing from 0 V. Accordingly, the tunneling electrons generated by applying a voltage of 0.1 V or higher cause disturbance in the magnetization of a magnetic material. Since the magnetic layers in a device are made of metal, the voltage is mostly applied to the tunnel barrier layer.

Figure 7:
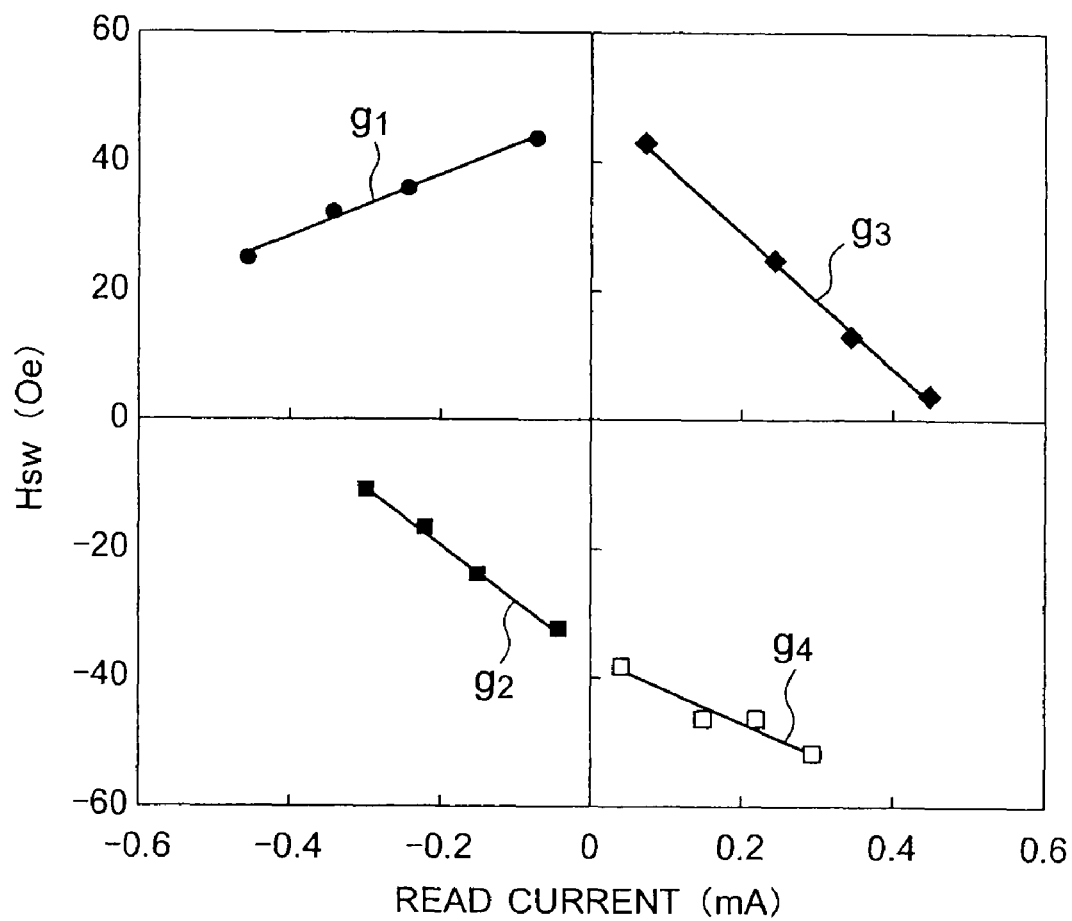
FIG. 7 shows the relationship between the current and the switching magnetic field of a second magnetoresistive element as a second reference example.

Next, as a second reference example, the inventors produced a second magnetoresistive element that was the same as the first magnetoresistive element shown in FIG. 2, except that the film thickness of the tunnel barrier layer is 0.6 nm, instead of 1.0 nm. The second magnetoresistive element was then processed to have a size of approximately 100 nm×150 nm. While a current was applied to the second magnetoresistive element, the external magnetic field parallel to the magnetization direction of the magnetization free layer was changed, and the coercive force Hc of the magnetization free layer was measured and evaluated. FIG. 7 shows the results of the measurement and evaluation.

In FIG. 7, the direction in which a current flows from the magnetization pinned layer to the magnetization free layer is the positive direction. The graph $g_1$ shows the switching magnetic field observed when the magnetization direction of the magnetization free layer changes from a parallel direction to an antiparallel direction with respect to the magnetization pinned layer after electrons are injected from the magnetization pinned layer to the magnetization free layer. The graph $g_2$ shows the switching magnetic field observed when the magnetization direction of the magnetization free layer changes from an antiparallel direction to a parallel direction after electrons are injected from the magnetization pinned layer to the magnetization free layer. The graph $g_3$ shows the switching magnetic field observed when the magnetization direction of the magnetization free layer changes from a parallel direction to an antiparallel direction after electrons are injected from the magnetization free layer to the magnetization pinned layer. The graph $g_4$ shows the switching magnetic field observed when the magnetization direction of the magnetization free layer changes from an antiparallel direction to a parallel direction after electrons are injected from the magnetization free layer to the magnetization pinned layer.

As can be seen from FIG. 7, where electrons are injected to the magnetization free layer through the tunnel barrier layer, the coercive force Hc of the magnetization free layer (the difference between the switching magnetic field represented by the graph $g_1$ and the switching magnetic field represented by the graph $g_2$ with respect to the same current value) decreases at a rate of approximately 67 Oe/mA, as the size of current (the absolute value of current) becomes larger. Meanwhile, where electrons are injected to the magnetization free layer from the upper electrode in a drifting manner, the coercive force Hc of the magnetization free layer (the difference between the switching magnetic field represented by the graph $g_3$ and the switching magnetic field represented by the graph $g_4$ with respect to the same current value) decreases at a rate of approximately 28 Oe/mA, as the size of current (the absolute value of current) becomes larger. As those phenomena were examined closely, it was found that, where electrons were injected through the tunnel barrier layer, the magnetization of the magnetization free layer (magnon) was disturbed by the energy generated by the electrons injected to the magnetization free layer through the tunnel barrier layer if the voltage applied to the tunnel barrier was reasonably larger energy than the energy of room temperature (approximately 0.025 eV).

As described above, the energy to achieve the effect of electrons disturbing the magnetization free layer should be 0.1 eV or more, and the reversed current can be reduced by adding the effect of electrons disturbing the magnetization free layer to the energy inversed by the above described spin momentum transfer.

Figure 1:
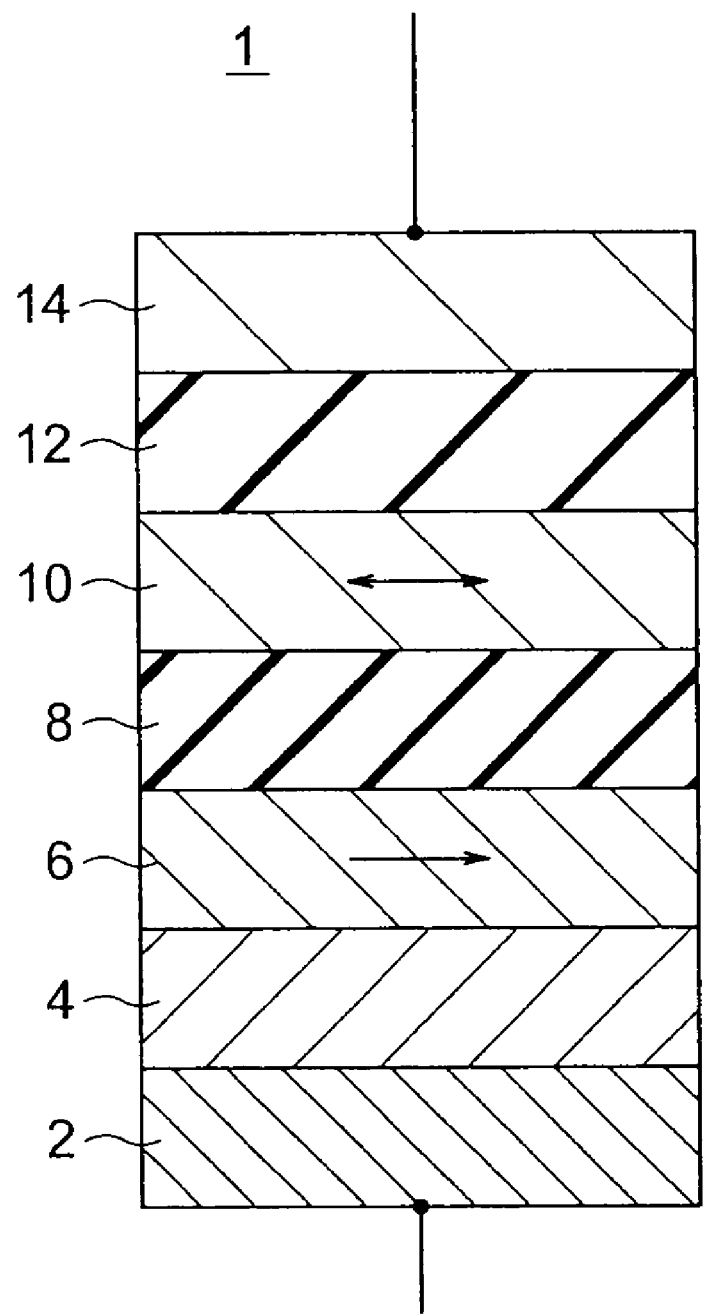
FIG. 1 is a cross-sectional view of a magnetoresistive element according to a first embodiment.

Therefore, a magnetoresistive element in accordance with the first embodiment of the present invention is designed to have tunnel barrier layers on and below a magnetization free layer. More specifically, as shown in FIG. 1, the magnetoresistive element 1 of the first embodiment includes: a lower electrode 2; an antiferromagnetic layer 4 that is formed on the lower electrode 2, has a film thickness of 20 nm, and is made of PtMn; a magnetization pinned layer 6 that is formed on the antiferromagnetic layer 4 and has a stacked structure consisting of a CoFe layer having a film thickness of 2 nm, a Ru layer having a film thickness of 0.6 nm, and a CoFe layer having a film thickness of 2 nm, for example; a first tunnel barrier layer 8 that is formed on the magnetization pinned layer 6, has a film thickness of 0.7 nm, and is made of MgO; a magnetization free layer (storage layer) 10 that is formed on the first tunnel barrier layer 8, has a film thickness of 2 nm, and is made of CoFe; a second tunnel barrier layer 12 that is formed on the magnetization free layer 10, has a film thickness of 0.55 nm, and is made of alumina; a cap layer (not shown) that is formed on the second tunnel barrier layer 12, has a film thickness of 5 nm, and is made of Ta; and an upper electrode 14 that is formed on the cap layer.

As described above, the magnetoresistive element of this embodiment has a tunnel barrier layer on either side of the magnetization free layer. Accordingly, high-energy electrons can be injected to the magnetization free layer through the tunnel barrier layers in both positive and negative current directions. Thus, the reversed current at the time of a magnetization reversal can be further reduced.

The structure of the magnetoresistive element of this embodiment is similar to the structure of a dual-pin magnetoresistive element. A dual-pin magnetoresistive element has a stacked structure having a first magnetization pinned layer, a first tunnel barrier layer, a magnetization free layer, a second tunnel barrier layer, and a second magnetization pinned layer stacked in this order. In other words, a dual-pin magnetoresistive element has the same structure as this embodiment, except that the second magnetization pinned layer is provided between the second tunnel barrier layer 12 and the upper electrode 14.

Compared with the conventional single-pin magnetoresistive element shown in FIG. 2, the dual-pin magnetoresistive element has a smaller write current when a current is caused to flow from the first magnetization pinned layer to the second magnetization pinned layer. In the dual-pin magnetoresistive element, however, the magnetoresistive effects of the upper and lower tunnel barrier layers cancel the resistance change of each other. Accordingly, the dual-pin magnetoresistive element has a smaller series magnetoresistive effect than the magnetoresistive element of this embodiment, and has the problem of lower outputs. A magnitude of the magnetoresistive effect varies by the manufacturing process, and as a result, a variation in the magnetoresistive element resistance becomes larger. Also, the dual-pin magnetoresistive element has a larger number of stacked films than the magnetoresistive element of this embodiment, and a longer period of time is required for manufacturing the dual-pin magnetoresistive element.

Figure 9:
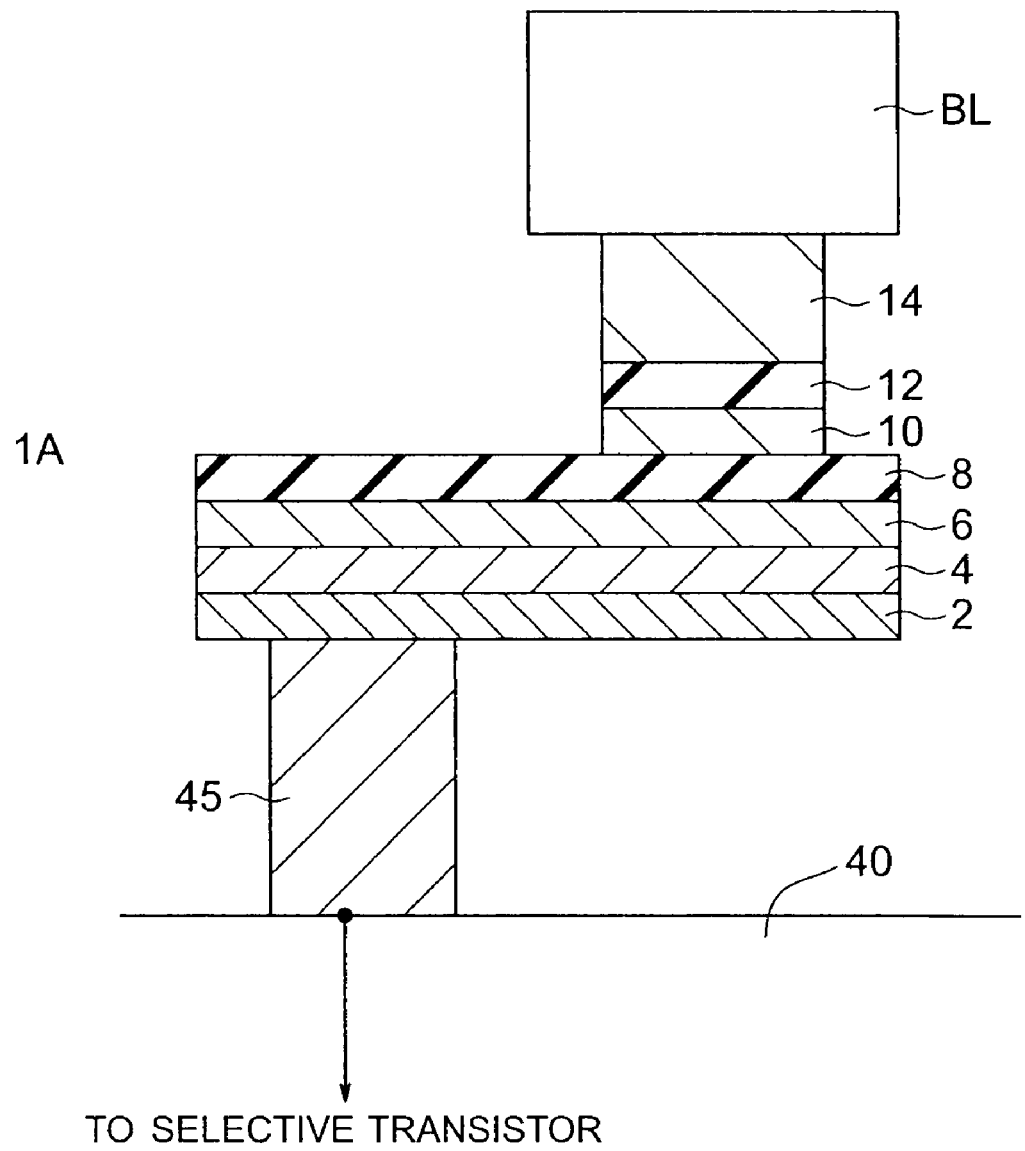
FIG. 9 is a cross-sectional view of a memory cell of the magnetic memory according to the second embodiment.

If an extension electrode that electrically connects the lower electrode 2 and a later described plug 45 shown in FIG. 9 is provided between the lower electrode 2 and the plug 45, the magnetoresistive element of this embodiment can be used as a memory element in a magnetic memory.

Second Embodiment

Figure 8:
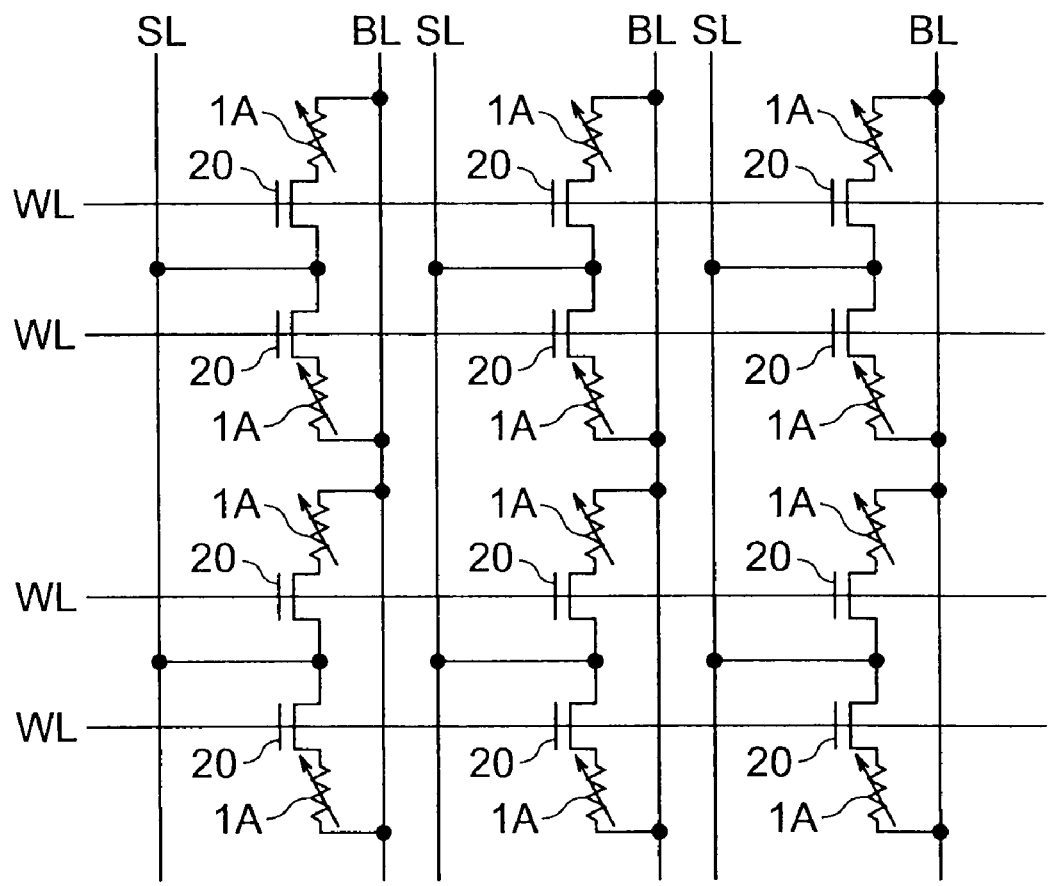
FIG. 8 is a circuit diagram of a magnetic memory according to a second embodiment of the present invention.

Referring now to FIGS. 8 to 13, a magnetic memory in accordance with a second embodiment of the present invention is described. As shown in FIG. 8, the magnetic memory of this embodiment has a plurality of memory cells arranged in a matrix form. Each of the memory cells has a magnetoresistive element 1A, a selective transistor 20, a bit line BL and a source line SL provided for each column, and a word line WL provided for each row. One end of the magnetoresistive element 1A is connected to the bit line BL of the corresponding column, and the other end is connected to the drain of the selective transistor 20 of the same memory cell. The gate of the selective transistor 20 is connected to the word line WL of the corresponding row. The sources of the selective transistors 20 of the two neighboring memory cells of the same column are connected to each other and to the source line SL of the corresponding column.

Figure 10:
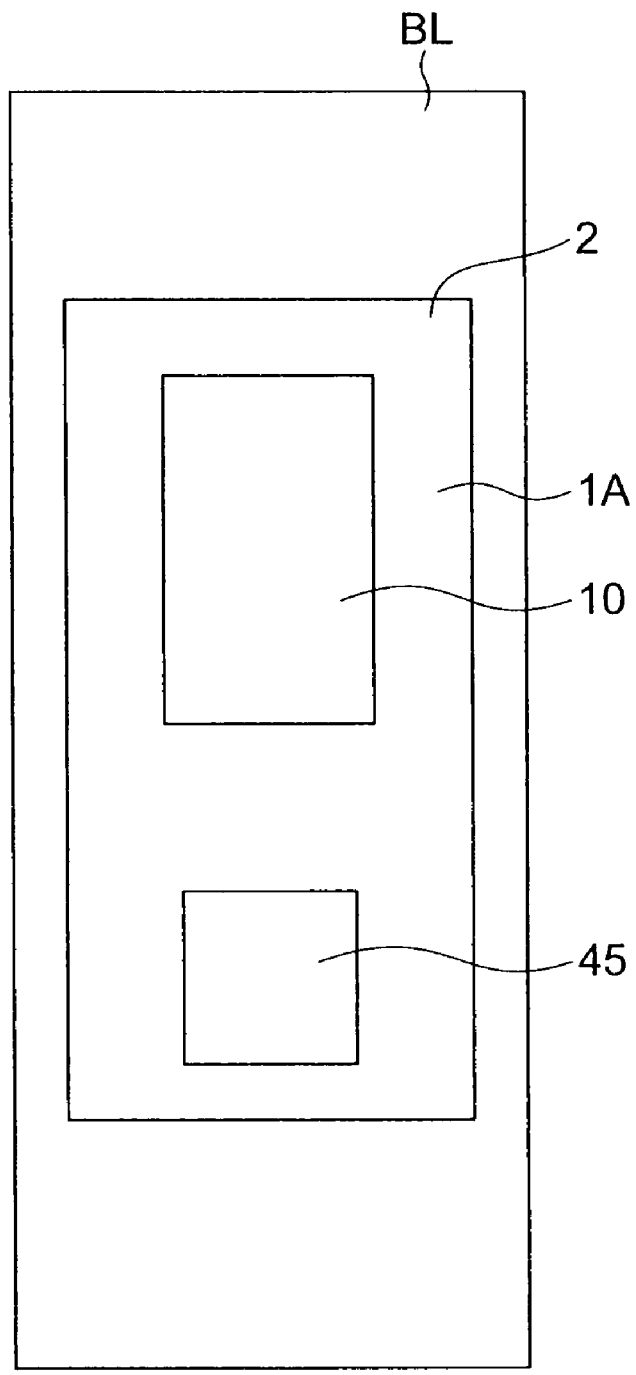
FIG. 10 is a plan view of a memory cell of the magnetic memory according to the second embodiment.

FIG. 9 is a cross-sectional view of the magnetoresistive element 1A of the magnetic memory in accordance with this embodiment. FIG. 10 is a plan view of the magnetoresistive element 1A, seen from the above.

The selective transistor 20 and the likes are formed on a substrate 40, and the plug 45 having one end connected to the selective transistor 20 is provided. The magnetoresistive element 1A includes a lower electrode 2, an antiferromagnetic layer 4 formed on the lower electrode 2 connected to the other end of the plug 45, a magnetization pinned layer 6 formed on the antiferromagnetic layer 4, a first tunnel barrier layer 8 formed on the magnetization pinned layer 6, a magnetization free layer (storage layer) 10 formed on the first tunnel barrier layer 8, a second tunnel barrier layer 12 formed on the magnetization free layer 10, a cap layer (not shown) formed on the second tunnel barrier layer 12, and an upper electrode 14 formed on the cap layer. The stacked films from the magnetization free layer 10 to the upper electrode 14 are designed to have a smaller film plane area than the stacked films from the lower electrode 2 to the first tunnel barrier layer 8. The upper electrode 14 is connected to the corresponding bit line BL. In this embodiment, the line connecting the centers of the magnetization free layer 10 and the plug 45 runs parallel to the longitudinal axis direction of the bit line BL or the magnetization pinned layer 6, as shown in FIG. 10.

The magnetoresistive element 1A in accordance with this embodiment is formed in the following manner.

First, the selective transistor 20 and the likes are formed on the substrate 40, and the plug 45 having one end connected to the selective transistor 20 is provided. The following films are then stacked one by one: a 10-nm thick Ta layer as the lower electrode 2 connected to the other end of the plug 45; a 20-nm thick PtMn layer as the antiferromagnetic layer 4; stacked films as the magnetization pinned layer 6 consisting of a 2-nm thick CoFe layer, a 0.6-nm thick Ru layer, and a 2-nm thick CoFe layer; a 0.7-nm thick MgO layer as the first tunnel barrier layer 8; a 2-nm thick CoFe layer as the magnetization free layer 10; a 0.55-nm thick alumina layer as the second tunnel barrier layer 12; a 5-nm thick Ta layer as the cap layer (not shown); and a 60-nm thick Ta layer as the upper electrode 14. The alumina layer 12 is formed by depositing a 0.42-nm thick Al film and then oxidizing the Al with an oxygen radical in vacuum. To pin the magnetization of the magnetization pinned layer 6, annealing is performed at 330° C. in a magnetic field.

Figure 11A:
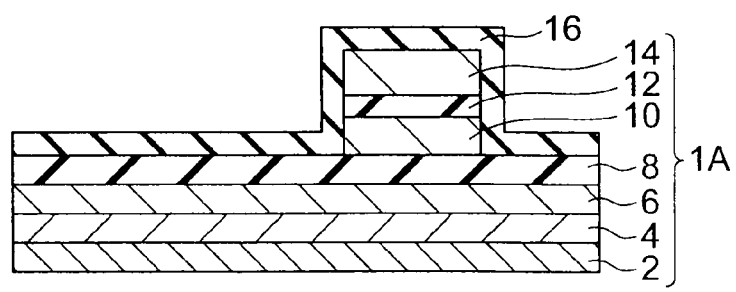
FIGS. 11A to 11C are cross-sectional views illustrating the procedures for manufacturing the magnetic memory according to the second embodiment.

Next, as shown in FIG. 11A, the films from the upper electrode 14 to the free magnetic layer 10 are shaped into a predetermined form of 100 nm×150 nm by a photolithography technique. Here, the longitudinal direction of the magnetization free layer is made parallel to the magnetization pinned direction of the magnetization pinned layer, as shown in FIG. 10. After that, a 30-nm thick SiN film is deposited as a protection film 16, and the films from the protection film 16 to the lower electrode 2 are shaped into a predetermined form by a photolithography technique. To increase the magnetic anisotropy of the magnetization pinned layer 6 as much as possible, the longitudinal direction of the lower electrode 2 is also made parallel to the magnetization direction of the magnetization pinned layer 6, and the shape anisotropy should be utilized. By strengthening the anisotropy of the magnetization pinned layer 6, magnetization disturbance in the magnetization pinned layer 6 can be restrained, and the reversed current can be reduced.

Figure 11B:
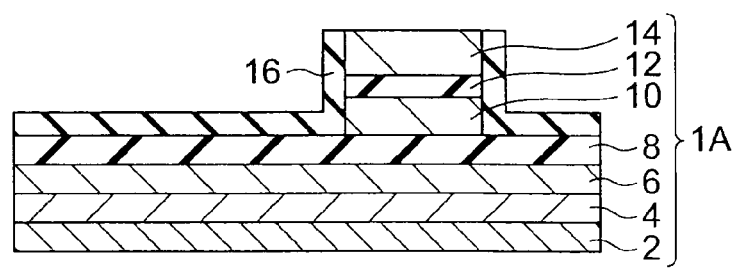
Figure 11C:
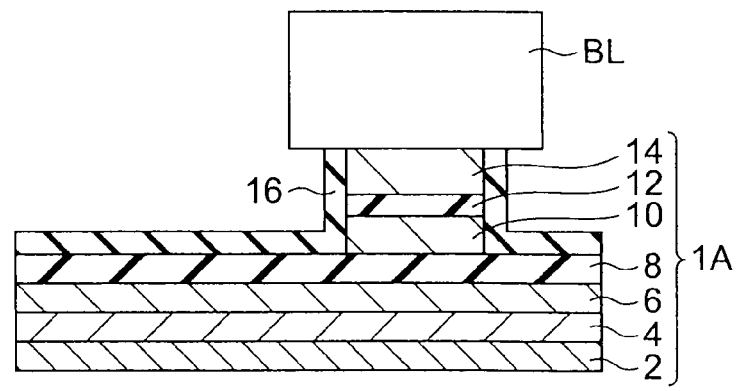

Next, as shown in FIG. 11B, an insulating film (not shown) made of $SiO_2$ is deposited as an interlayer insulating film on the entire surface. After that, flattening is performed by CMP (Chemical Mechanical Polishing), so as to expose the upper face of the upper electrode 14. A 10-nm thick Ti layer, a 400-nm thick Al layer, a 10-nm thick Ti layer, and a 10-nm thick TiN layer are stacked in this order as a bit line, and the stacked films are shaped into a predetermined form, so as to form the bit line BL (see FIG. 11C). After that, a protection film for protecting the magnetoresistive element, an electrode for bonding, and the likes are formed.

In this embodiment, the resistance normalized by an area of the first tunnel barrier layer 8 is $10\Omega/\mu m^2$, and the resistance normalized by an area of the second tunnel barrier layer 21 is $10\Omega/\mu m^2$.

Figure 12:
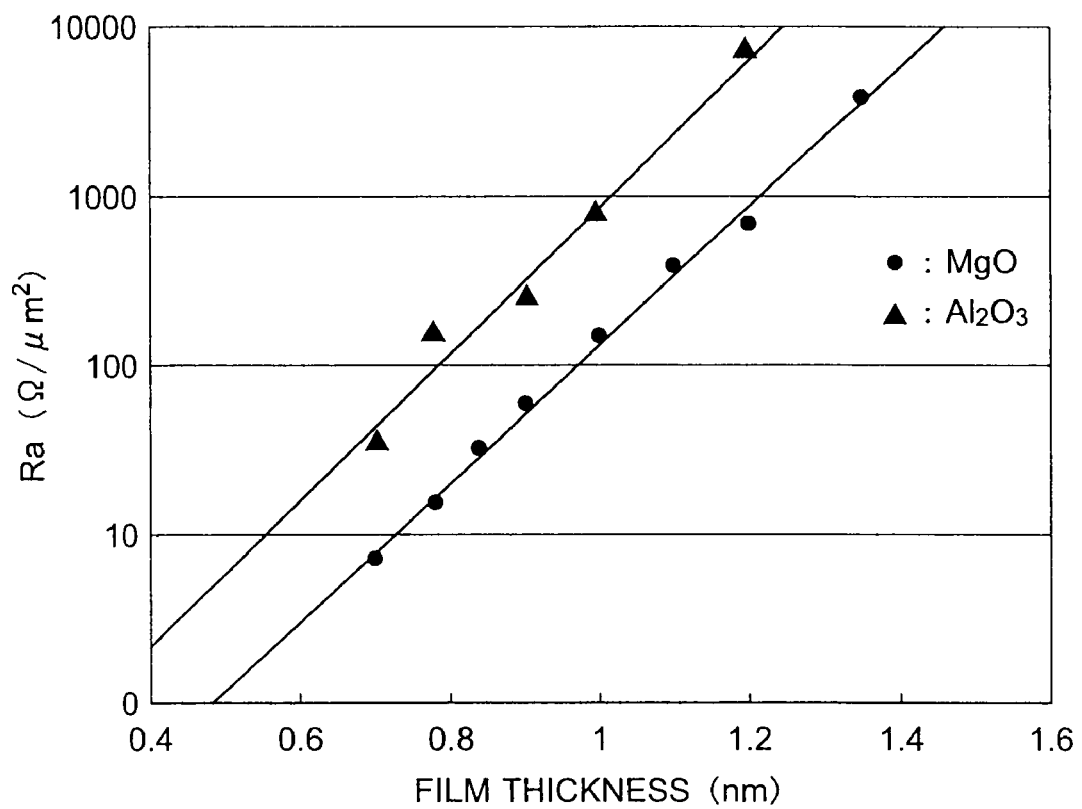
FIG. 12 shows the difference in area normalization resistance due to the difference in the material of the tunnel barrier layer.

For reference, FIG. 12 shows the relationship between the thickness (nm) and the resistance normalized by an area normalization Ra ($\Omega/\mu m^2$) of the tunnel barrier layer in a case where the materials of the tunnel barrier layer are MgO and alumina ($Al_2O_3$). There are small variations due to the influence of oxidation or the like of the magnetic material at the interface. Particularly, after Al is deposited, $Al_2O_3$ forms a barrier tunnel layer made of $Al_2O_3$ through oxidation. Accordingly, the characteristics of the resultant layer greatly vary, depending on the conditions for oxidation as described above. On the other hand, the tunnel barrier layer made of MgO is relatively stable, as formed by directly depositing MgO.

In the case of the magnetoresistive element in accordance with this embodiment, the voltage required for writing is approximately 0.4 V, whether it is a positive or negative voltage. If reading is performed at a reasonably practical speed, the voltage to be applied to the magnetoresistive element needs to be set at 0.1 V or higher, because of the capacitive time constant and sensitivity as a circuit. Meanwhile, since writing and reading are performed through the same current path, it is necessary to design the structure so as to perform writing at a voltage at least three times higher than the voltage for reading, though the voltage value varies among magnetoresistive elements. In this manner, inadvertent writing by the magnetoresistive element can be prevented at the time of reading. In view of the above restriction, the write voltage needs to be 0.4 V or higher.

When writing is performed at a write voltage of 0.4 V, the resistance ratio between the first tunnel barrier layer 8 and the second tunnel barrier layer 12 needs to be in the range of 1:0.25 to 1:4, so that a voltage of 0.08 or higher (see FIG. 6) to be applied to increase the disturbance is distributed to the two tunnel barrier layers. When this is calculated according to the graph shown in FIG. 12, the difference in film thickness between the two tunnel barrier layers is set at 0.14 nm or smaller in a case where the tunnel barrier layers 8 and 12 are made of the same material and have tunnel junctions with the same areas (in a case of the magnetoresistive element of the first embodiment, for example). The value of 0.14 nm is obtained in the following manner. The relationship between Ra ($\Omega/\mu m^2$) and the film thickness d of MgO is expressed by the following approximate expression according to FIG. 12:

$$Log(Ra) = 4.18 \times d - 2.09$$

or $Ra = 10^{4.18 \times d - 2.09}$ where the resistance ratio is the Ra ratio, if the two tunnel junctions have the same areas. Where the film thickness of the first tunnel barrier layer 8 is d1, and the film thickness of the second tunnel barrier layer 12 is d2, the following expression is obtained:

$$10^{4.18 \times d1 - 2.09}/10^{4.18 \times d2 - 2.09} = 1/4$$

$$\text{or } 10^{4.18 \times (d1-d2)} = 1/4$$

$$\text{or } d1 - d2 \approx 0.14$$

Like the magnetoresistive element of the first embodiment, the magnetoresistive element 1A of this embodiment has a tunnel barrier layer on either side of the magnetization free layer. Accordingly, high-energy electrons can be injected to the magnetization free layer through the tunnel barrier layers in both positive and negative current directions. Thus, the reversed current caused at the time of a magnetization reversal can be further reduced.

Figure 13:
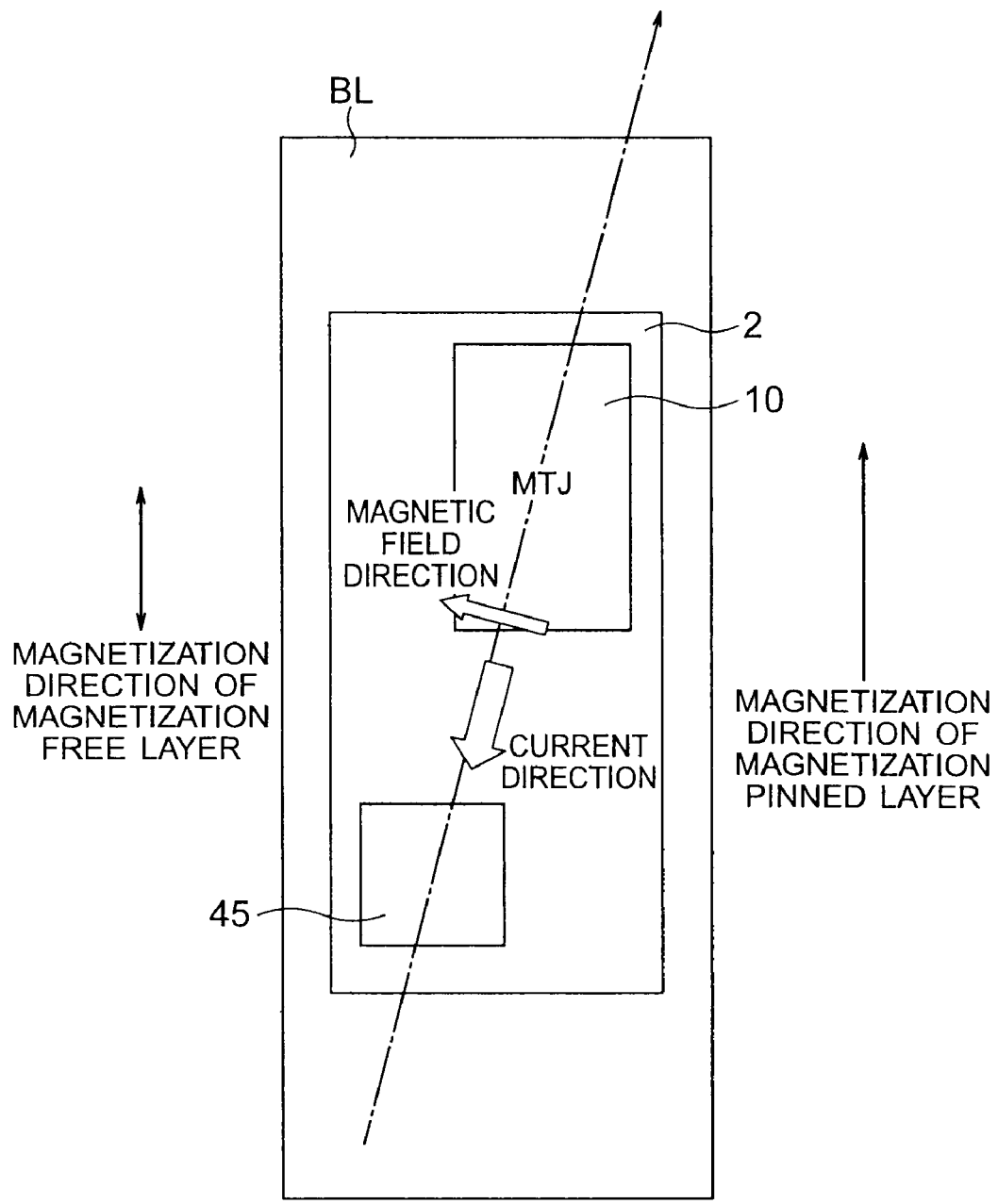
FIG. 13 is a plan view of a magnetic memory according to a modification of the second embodiment.

In this embodiment, the line connecting the center points of the magnetization free layer 10 and the plug 45 runs parallel to the longitudinal axis direction of the bit line BL or the lower electrode 2 (see FIG. 10), as described above. However, as shown in the plan view of FIG. 13, the line connecting the center points of the magnetization free layer 10 and the plug 45 is tilted with respect to the longitudinal axis direction of the bit line BL or the magnetization pinned layer 6 (the magnetization direction of the magnetization pinned layer 6), so that the magnetic field induced by the current flowing through the magnetization pinned layer 6 and the lower electrode 2 can facilitate a magnetization reversal of the magnetization free layer 10. For example, in the structure shown in FIG. 13, a positive voltage is applied to the bit line BL, and a current is caused to flow from the bit line BL to the plug 45 through the magnetoresistive element 1A. In this manner, a current flows in the direction indicated by the thicker arrow in FIG. 13. The direction of the magnetic field induced on the lower electrode 2 by this current is indicated by the thinner arrow in FIG. 13. Since the power that causes a reversal through a spin momentum transfer is basically an irregular force caused within the magnetoresistive element, it is known that such power cannot be utilized efficiently. Therefore, a magnetic field component that is at right angle to the magnetization direction of the magnetization free layer 10 is induced by the above magnetic field in the direction indicated by the thinner arrow. This magnetic field component assists the magnetic field that is at right angle to the magnetization direction of the magnetization free layer 10, so that the directions at the time of a reversal are aligned, and the reversed current can be reduced. Here, it is important to assist the magnetic field that is at right angle to the magnetization direction of the magnetization free layer 10. The experiment conducted by the inventors shows that the line connecting the center point of the magnetoresistive element (the center point of the magnetization free layer 10 in FIG. 13) and the center point of the plug 45 for connecting to the lower transistor is preferably tilted at a 0 to 45 degrees angle with respect to the magnetization direction of the magnetization pinned layer, as shown in FIG. 13. The magnetoresistive elements produced in the above described manner have smaller reversed currents, have smaller variations, and can be operated in an excellent condition as a memory.

Third Embodiment

Referring now to FIGS. 14A to 17B, a magnetic memory in accordance with a third embodiment of the present invention is described. The magnetic memory of this embodiment has the same fundamental structure as the magnetic memory of the second embodiment, and therefore, only the different points will be described. There are two significant points that are different from the second embodiment. The first point is that MgO was used as the material for the second tunnel barrier layer 12 of each magnetoresistive element. The second point is that magnetoresistive elements were miniaturized.

The procedures up to the deposition of the magnetization free layer 10 are the same as those of the second embodiment. After a 2-nm thick CoFe layer was deposited as the magnetization free layer, a 0.6-nm thick MgO layer was deposited as the second tunnel barrier layer 13. A cap layer was then deposited in the same manner as in the second embodiment, and a 15-nm thick Ta layer was stacked as the first upper electrode 14. In general, metal microfabrication is difficult, because reaction products adhere back to the sidewalls and the likes of magnetoresistive elements, and tapered portions are formed to increase the size of each element during the processing by RIE (Reactive Ion Etching). Therefore, it is important to minimize the film thickness of the Ta film to be subjected to microfabrication. The magnetic field annealing for pinning the magnetization of the magnetization pinned layer 6 was performed at 360° C.

Figure 14A:
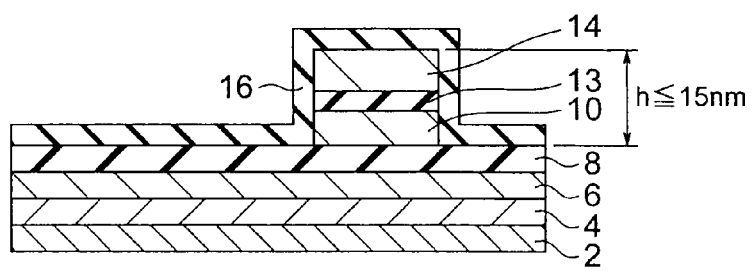
FIGS. 14A to 14C are cross-sectional views illustrating the procedures for manufacturing a magnetic memory according to a third embodiment.
Figure 14B:
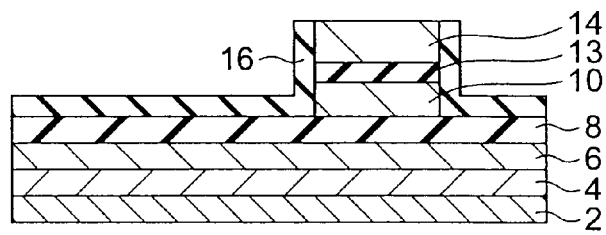

The films from the upper electrode 14 to the magnetization free layer 10 were then shaped into a size of 40 nm×60 nm by a photolithography technique. After that, a 20-nm thick SiN layer was deposited as a protection film 16, as shown in FIG. 14A, and a 20-nm thick $SiO_2$ layer was deposited as an interlayer insulating film (not shown). In this embodiment, the step h formed between the first upper electrode 14 and the first tunnel barrier layer 8 is merely 15 nm in height, and it is preferable that an insulating film having a thickness twice or more as large as the step h is deposited so as to expose the upper face of the first upper electrode 14 after the flattening process. If the film thickness of the deposited films becomes larger, the amount of polishing required for exposing the upper face of the first upper electrode 14 becomes larger, and the yield decreases due to insufficient or excessive polishing or variations in production. To counter this problem, the total film thickness of SiN and $SiO_2$ was twice or slightly more as large as the step h.

Flattening is then performed by CMP. However, the polishing speed is high with conventional slurry for $SiO_2$ that is not suitable for the polishing in this embodiment requiring high precision. Therefore, slurry for Ta was used for the polishing in this embodiment, as the $SiO_2$, Ta, and SiN polishing rates were substantially the same with the slurry for Ta. In this embodiment, the $SiO_2$ polishing rate is approximately 20 nm/minute. Therefore, polishing was performed for approximately 1.5 minutes, so as to expose the upper face of the upper electrode 14 (see FIG. 14B).

Figure 14C:
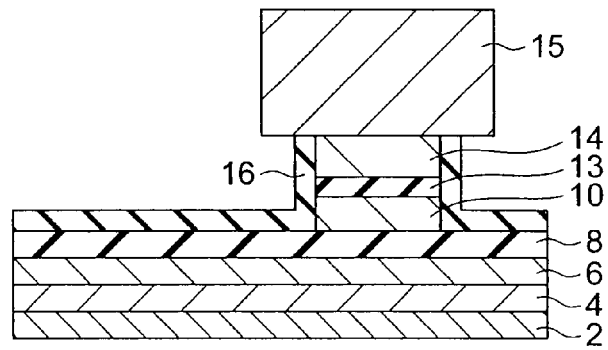

After that, an 80-nm thick Ta layer is deposited as a second upper electrode 15, as shown in FIG. 14C, and the second upper electrode 15 is shaped into a predetermined form by a photolithography technique. With the second upper electrode 15 serving as a mask, etching for removal is performed down to the lower electrode 2, and the lower electrode 2 is shaped into a predetermined shape in a self-alignment. In this manner, a magnetoresistive element 1B in accordance with this embodiment is formed (see FIG. 15A).

Figure 15A:
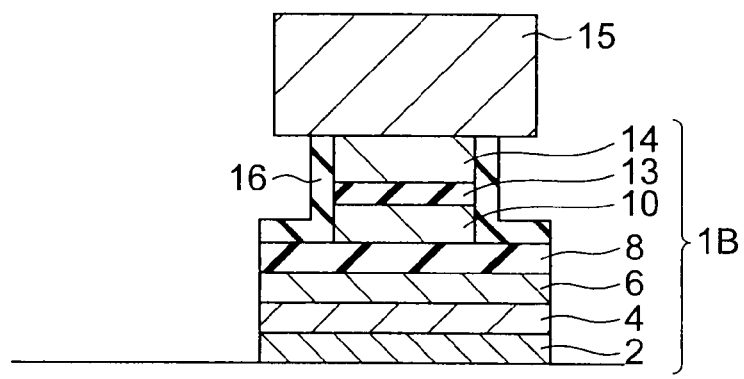
FIGS. 15A and 15B are cross-sectional views illustrating the procedures for manufacturing the magnetic memory according to the third embodiment.
Figure 15B:
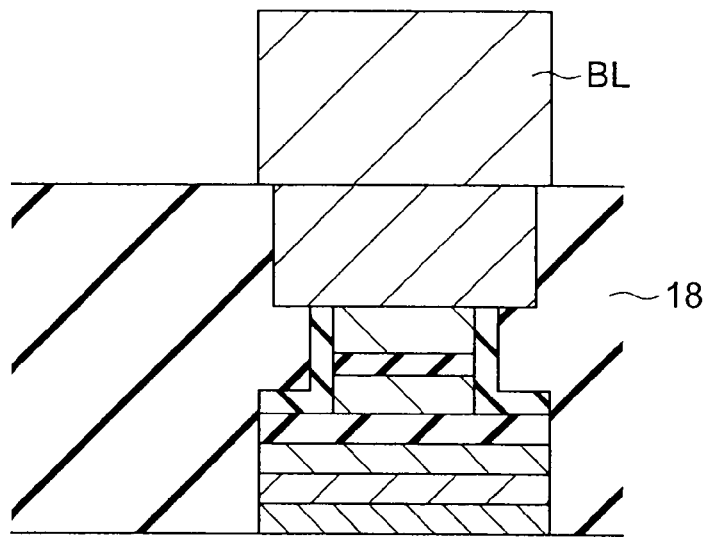

An interlayer insulating film 18 is then deposited, as shown in FIG. 15B, and the upper face of the second upper electrode 15 is exposed by CMP. After that, a 10-nm thick Ti layer, a 400-nm thick Al layer, a 10-nm thick Ti layer, and a 10-nm thick TiN layer are stacked. Those layers are then shaped into a predetermined form, so as to produce a bit line BL.

The second point of the second embodiment lies in that the upper electrode 14 is made thin so as to reduce the size of the magnetization free layer 10, and the procedure for first exposing the first upper electrode 14 by CMP should be carried out while there are no other steps or prior to the processing of the lower electrode 2. The other procedures may be modified, if necessary. For example, the upper face of the second upper electrode 15 may be exposed by forming a via in the interlayer insulating film, instead of by flattening by CMP. The via leads to the second upper electrode 15 designed to have a larger size than the magnetization free layer 10.

Figure 16:
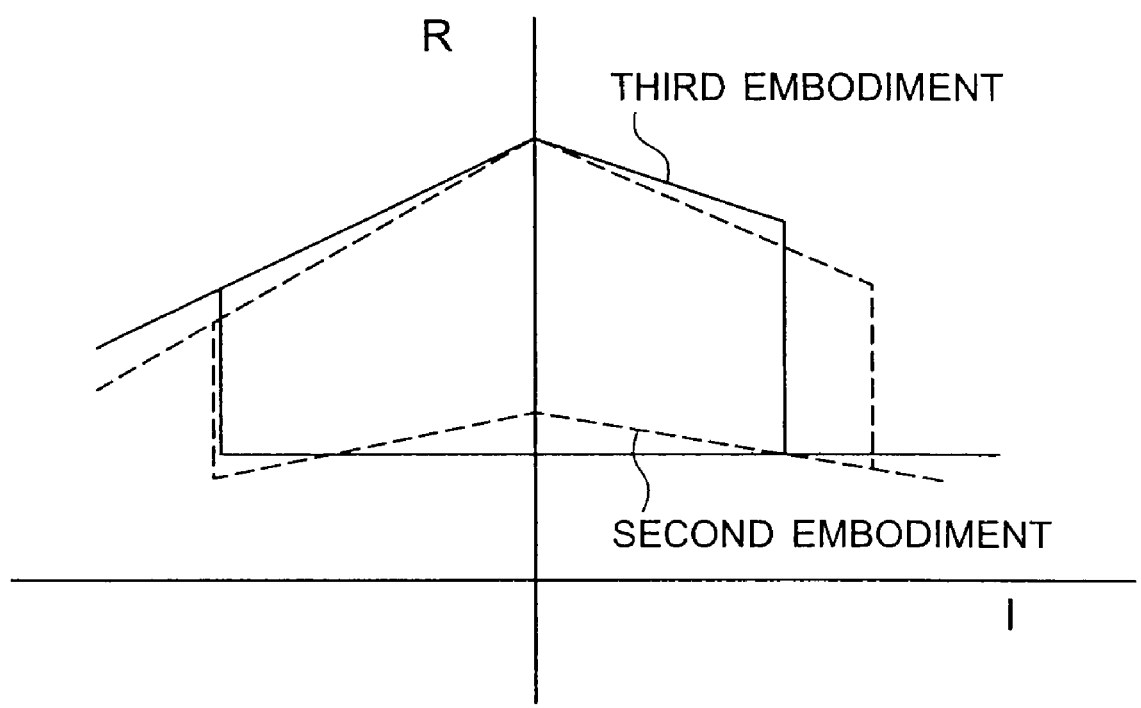
FIG. 16 shows the write characteristics of the magnetic memories of the second and third embodiments.
Figure 17:
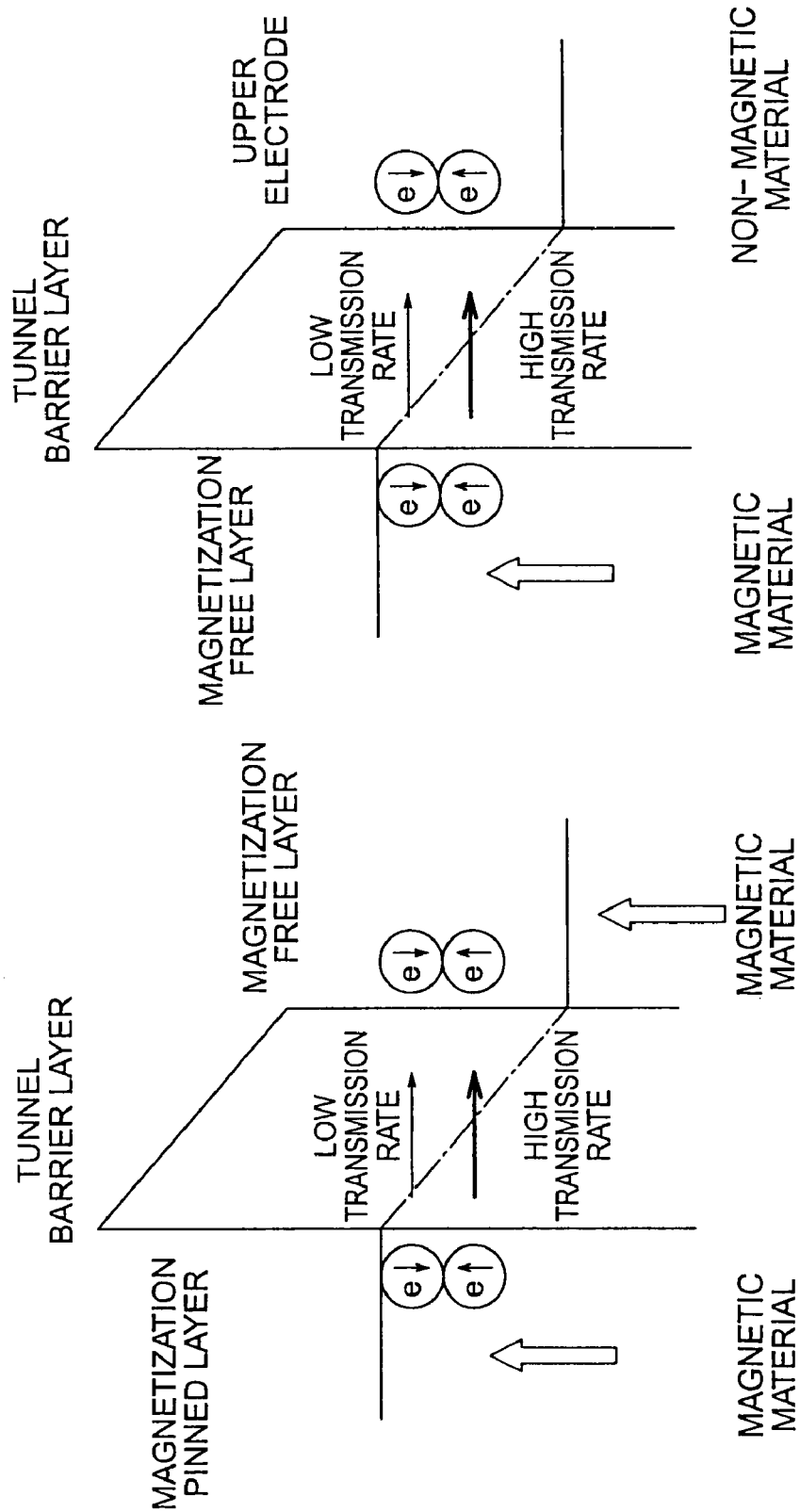
FIGS. 17A and 17B are energy band charts illustrating the effects of the magnetic memory according to the third embodiment.

The characteristics of the magnetoresistive element produced in the above described manner were examined. As shown in FIG. 16, in a case where a current is caused to flow from the bit line to the plug (a positive current is caused to flow), the characteristics of the magnetoresistive element 1B in accordance with the third embodiment (indicated by the solid line) show a smaller amount of reversed current than the characteristics of the magnetoresistive element 1A in accordance with the second embodiment. The inventors further examined this phenomenon to find that this phenomenon was caused by the MgO used in the second tunnel barrier layer 13 above the magnetization free layer.

As disclosed in the research paper (W. H. Butler et al., PHYSICAL REVIEW B, VOLUME 63, 054416), in a case where a CoFe-based magnetic layer and a MgO layer are stacked, the electron tunnel transmission rate is high if the direction of the majority spin in the magnetic material to which electrons are supplied is the same as the direction of the majority spin in the magnetic material at the tunneling destination (see FIG. 17A). However, effects that can be achieved in a case where the tunneling destination is a non-magnetic metal are not discussed in the research paper. On the other hand, the experiments conducted for this embodiment newly proved that the transmission rate of the majority electron spin in the magnetic layer to which electrons are supplied is high even if the tunneling destination is a non-magnetic material, as shown in FIG. 17B.

In the above described phenomenon, when a magnetic material is in contact with a non-magnetic metal material, the magnetic material and the non-magnetic material exchange spin electrons with each other. As a result, the spin polarization rate of the magnetic material near the interface might become lower, and the polarization rate of spins moving out from the magnetic material might also become lower. Compared with a metal, MgO has high resistance (exchanges less electrons) and has an aligned crystalline system. Accordingly, MgO does not degrade a magnetic material near the interface, and is suitable for emitting electrons having a high polarization rate from the magnetic material.

In the structure of this embodiment, electrons having the spins of the opposite direction having the energy for causing a larger disturbance in the magnetization free layer 10 are injected from the magnetization pinned layer 6 to the magnetization free layer 10, where the tunnel barrier layer 13 is made of MgO, the magnetization directions of the magnetization pinned layer 6 and the magnetization free layer 10 are antiparallel (opposite) to each other, and a current is applied in the direction extending from the upper electrode 14 to the lower electrode 2, or electrons are injected from the magnetization pinned layer 6 to the magnetization free layer 10. Until a reversal is made, the electrons having the opposite spins from the injected electrons are majority electrons. Therefore, the electrons having the opposite spins from the electrons injected mainly from the magnetization pinned layer 6 are selectively caused to pass from the magnetization free layer 10 to the upper electrode 14 through the tunnel barrier layer 13 made of MgO. As a result, the magnetization of the magnetization free layer 10 is reversed by the injection of the energy-retaining spins of the opposite direction from the magnetization pinned layer 6 and the transmission of the majority spins of the magnetization free layer 10 to the upper electrode 14. To maximize the above effect, the MgO of the tunnel barrier layer 13 should be preferentially oriented in the <100> direction.

As described above, in accordance with this embodiment, the reversed current at the time of a magnetization reversal can be further reduced. Furthermore, like the structure of the second embodiment, the structure shown in FIG. 13 causes only small variations, and can be operated as a memory in an excellent condition.

Fourth Embodiment

Figure 18:
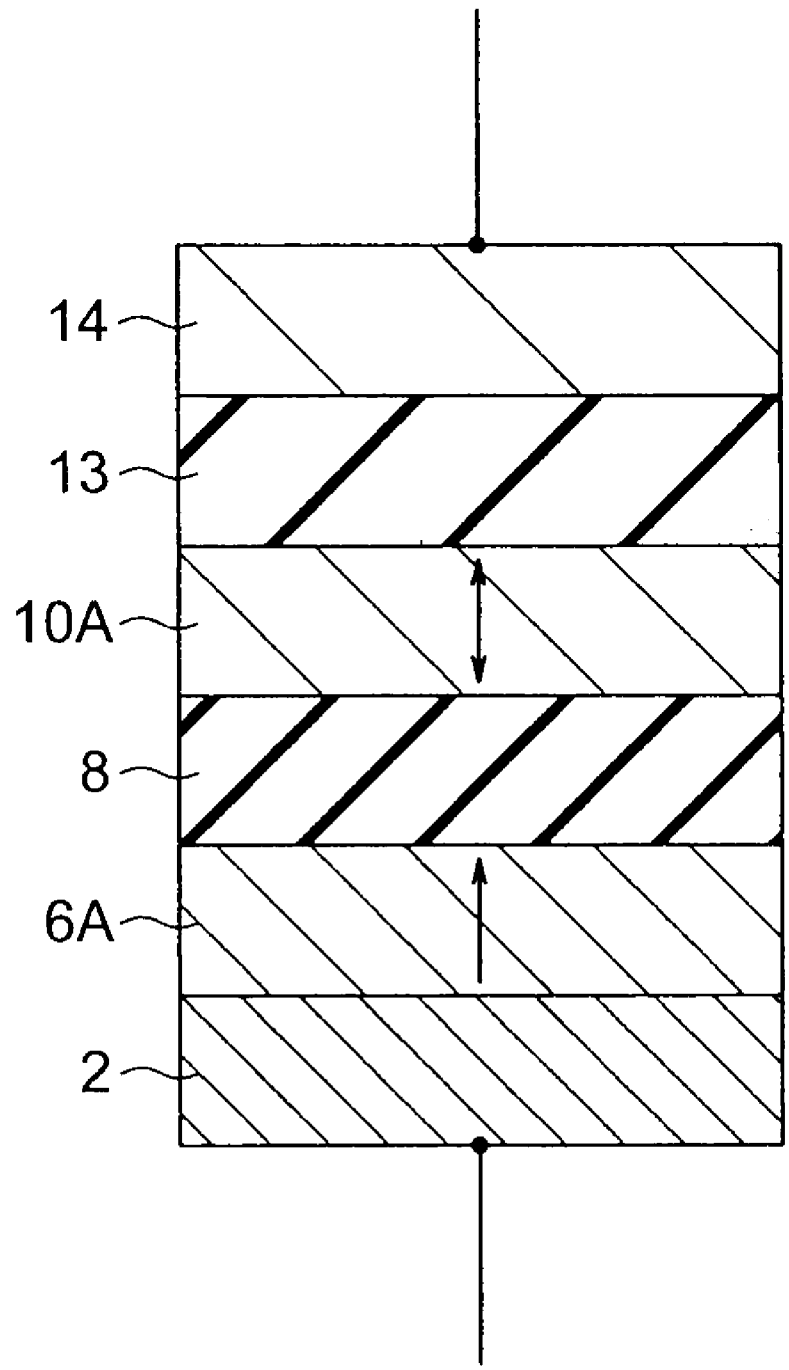
FIG. 18 is a cross-sectional view of a magnetoresistive element according to a fourth embodiment.

Referring now to FIG. 18, a magnetoresistive element in accordance with a fourth embodiment of the present invention is described. In each of the magnetoresistive elements in accordance with the first to third embodiments, the magnetization directions of the magnetization pinned layer 6 and the magnetization free layer 10 are parallel to the film plane. In the magnetoresistive element of this embodiment, on the other hand, a so-called vertically magnetized material that is magnetized in a direction perpendicular to the film plane is used for the magnetization pinned layer 6A and the magnetization free layer 10A. Accordingly, the magnetoresistive element of this embodiment includes the lower electrode 2, the magnetization pinned layer 6A, the first tunnel barrier layer 8, the magnetization free layer 10A, the second tunnel barrier layer 13, and the upper electrode 14. The magnetoresistive element of this embodiment differs from the magnetoresistive elements in accordance with the first to third embodiments in not including an antiferromagnetic layer.

The magnetoresistive element of this embodiment is manufactured in the following manner. First, a selective transistor and the likes were formed on a substrate. The following films were then stacked: a 10-nm thick Ta film as the lower electrode 2; a 20-nm thick buffer layer (not shown) made of a CrTi-based alloy; a 5-nm thick FePt layer as the magnetization pinned layer 6A; a 0.7-nm thick MgO layer as the first tunnel barrier layer 8; stacked films of a 1-nm thick Fe layer and a 3-nm thick FePt layer as the magnetization free layer 10A; and a 0.6-nm thick MgO layer as the second tunnel barrier layer 13. After a 80-nm thick Ti layer was stacked as the cap layer and the upper electrode 14, ordering annealing was performed at 400° C., so as to magnetize the magnetization pinned layer and the magnetization free layer in a perpendicular direction. Thus, a magnetoresistive element was completed in the same manner as in the first to third embodiments. Since the magnetization direction is perpendicular to the film plane in this embodiment, there is not a magnetic material that pins the magnetization direction of the magnetization pinned layer 6A. Accordingly, the magnetization of the magnetization pinned layer 6A is not pinned. However, to cause a difference in coercive force, the coercive force Hc in the "easy" magnetization direction and the coercive force Hk in the "hard" magnetization direction of the magnetization pinned layer 6A with respect to the magnetization free layer 10A.

Like the magnetoresistive element of the first embodiment, the magnetoresistive element of this embodiment has a tunnel barrier layer on either side of the magnetization free layer. Accordingly, high-energy electrons can be injected to the magnetization free layer through the tunnel barrier layers in both positive and negative directions, and the reversed current caused at the time of a magnetization reversal can be further reduced.

Fifth Embodiment

Next, a magnetoresistive element in accordance with a fifth embodiment of the present invention is described. The magnetoresistive element of this embodiment differs from the magnetoresistive element of the fourth embodiment in the vertically magnetized material used for the magnetization pinned layer 6A and the magnetization free layer 10A. The magnetoresistive element of this embodiment has the following structure. A selective transistor and the likes were first formed on a substrate, and the following films were stacked: a 10-nm thick Ta film as the lower electrode; a 10-nm thick magnetization pinned layer made of a TbCoFe-based alloy; a 1-nm thick Co layer as an interfacial layer; a 0.7-nm thick MgO layer as the first tunnel barrier layer; stacked films of a 1-nm thick Co layer and a 3-nm thick TbCoFe layer as the magnetization free layer; and a 0.6-nm thick MgO layer as the second tunnel barrier layer. After an 80-nm thick Ti layer was stacked as the cap layer and the upper electrode, a magnetoresistive element was completed in the same manner as in the fourth embodiment.

Like the magnetoresistive element of the first embodiment, the magnetoresistive element of this embodiment also has a tunnel barrier layer on either side of the magnetization free layer. Accordingly, high-energy electrons can be injected to the magnetization free layer through the tunnel barrier layers in both positive and negative directions, and the reversed current caused at the time of a magnetization reversal can be further reduced.

Sixth Embodiment

Next, a magnetoresistive element in accordance with a sixth embodiment of the present invention is described. In the magnetoresistive element of this embodiment, the first tunnel barrier layer that generates spin torques has a larger area. In a case of a spin-injection magnetoresistive element that has a magnetization free layer (a storage layer) made of a soft magnetic material such as CoFe (B) or NiFe, the switching current is proportional to the thermal fluctuation index that indicates the tolerance to thermal fluctuation of the magnetoresistive element. Accordingly, once the thermal fluctuation index necessary for the magnetoresistive element is determined, the current is automatically determined.

To maintain the tolerance of the tunnel barrier layers, the current density in the tunnel barrier layers should be as low as possible. If the current amount is fixed, the tunnel barrier layers should have larger areas, so as to achieve higher reliability. By a conventional method, however, the area of each tunnel barrier layer is the same as the area of the magnetic material. To increase the area while maintaining the same thermal fluctuation index (or while maintaining the switching current), it is necessary to reduce the film thickness of the magnetic material. Since the magnetization directions of the magnetization pinned layer and the magnetization free layer are affected by the shape anisotropy induced by the shape of the magnetic material, the shape of the magnetic material is also restricted. In the case of the magnetic material made of CoFe as used by the inventors of the present invention, preferred shape anisotropy was not caused when the film thickness was smaller than 1.5 nm, and good hysteresis characteristics were not obtained.

This embodiment is designed to solve the above problems. Referring now to FIGS. 19A to 21, a method for manufacturing the magnetoresistive element of this embodiment is described.

Figure 19A:
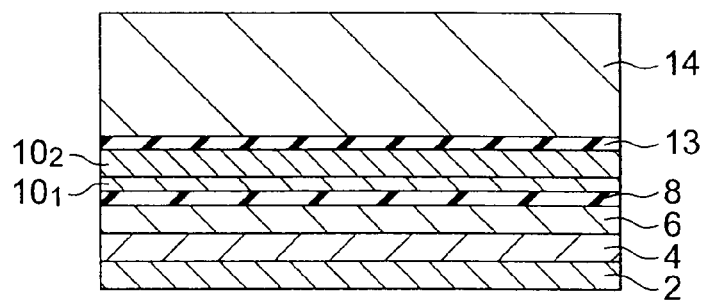
FIGS. 19A to 19C are cross-sectional views illustrating the procedures for manufacturing a magnetoresistive element according to a sixth embodiment.

First, as shown in FIG. 19A, a selective transistor and the likes are first formed on a substrate (not shown), and the following films are formed in this order: a 10-nm thick lower electrode 2 made of Ta; a 20-nm thick antiferromagnetic layer 4 made of PtMn; a magnetization pinned layer 6 having a stacked structure consisting of a 2-nm thick CoFe layer, a 0.6-nm thick Ru layer, and a 2-nm thick CoFe layer; a 0.8-nm thick first tunnel barrier layer 8 made of MgO; a 1.5-nm thick first magnetization free layer 10₁ made of CoFe; a 6-nm thick second magnetization free layer 10₂ made of NiFe; a 1-nm thick interfacial layer (not shown) made of CoFe; and a 0.6-nm thick second tunnel barrier layer 13 made of MgO. A 60-nm thick upper electrode 14 made of Ta is then formed. After that, the magnetization direction of the magnetization pinned layer 6 is pinned, and annealing is performed in a magnetic field at 360° C., so as to increase the crystallinity of the CoFe layer at the interface between the magnetization pinned layer 6 and the first tunnel barrier layer 8.

Figure 19B:
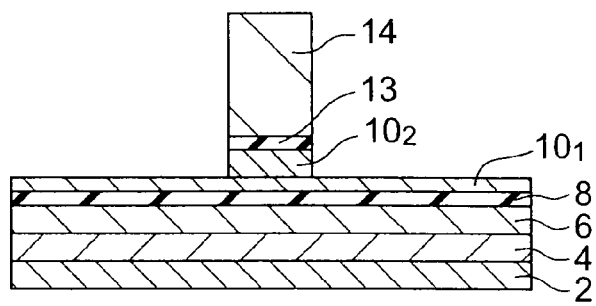
Figure 19C:
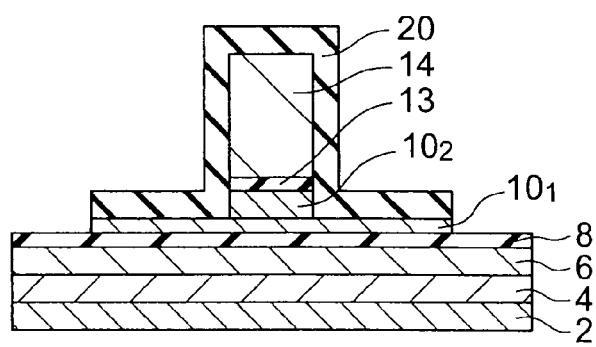

The films from the upper electrode 14 to the second magnetization free layer 10₂ are shaped into a predetermined form of 30 nm×100 nm by a photolithography technique (see FIG. 19B). A 30-nm thick SiN film is then deposited as a protection film 20, as shown in FIG. 19C. The films from the protection film 20 to the first magnetization free layer 10₁ are then shaped into a predetermined form by a photolithography technique.

Figure 20A:
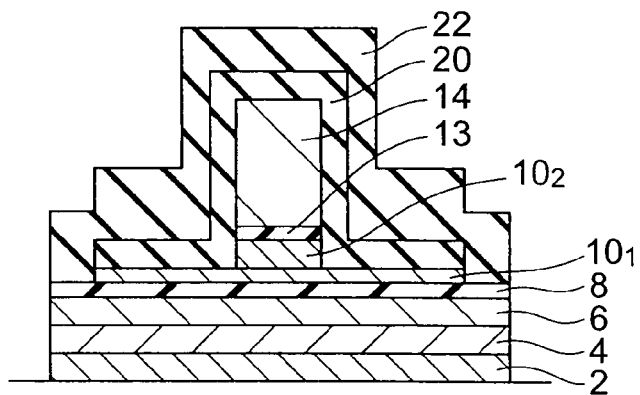
FIGS. 20A to 20C are cross-sectional views illustrating the procedures for manufacturing the magnetoresistive element according to the sixth embodiment.

A 30-nm thick SiN film is then deposited as a protection film 22, as shown in FIG. 20A, and the films from the protection film 22 to the lower electrode 2 are shaped into a predetermined form by a photolithography technique.

Figure 20B:
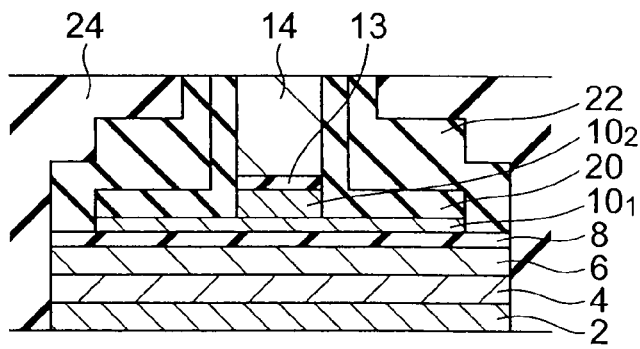
Figure 20C:
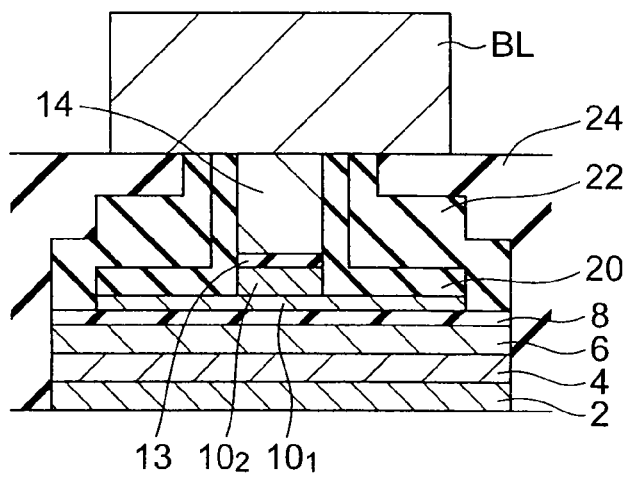

An interlayer insulating film 24 made of $SiO_2$ is then formed, as shown in FIG. 20B, and flattening is performed by CMP, so as to expose the upper face of the upper electrode 14. After that, a 10-nm thick Ti layer, a 400-nm thick Al layer, a 10-nm thick Ti layer, and a 10-nm thick TiN layer are stacked as the bit line BL, as shown in FIG. 20C. The stacked layers are then shaped into a predetermined form, so as to complete a magnetoresistive element.

Figure 21:
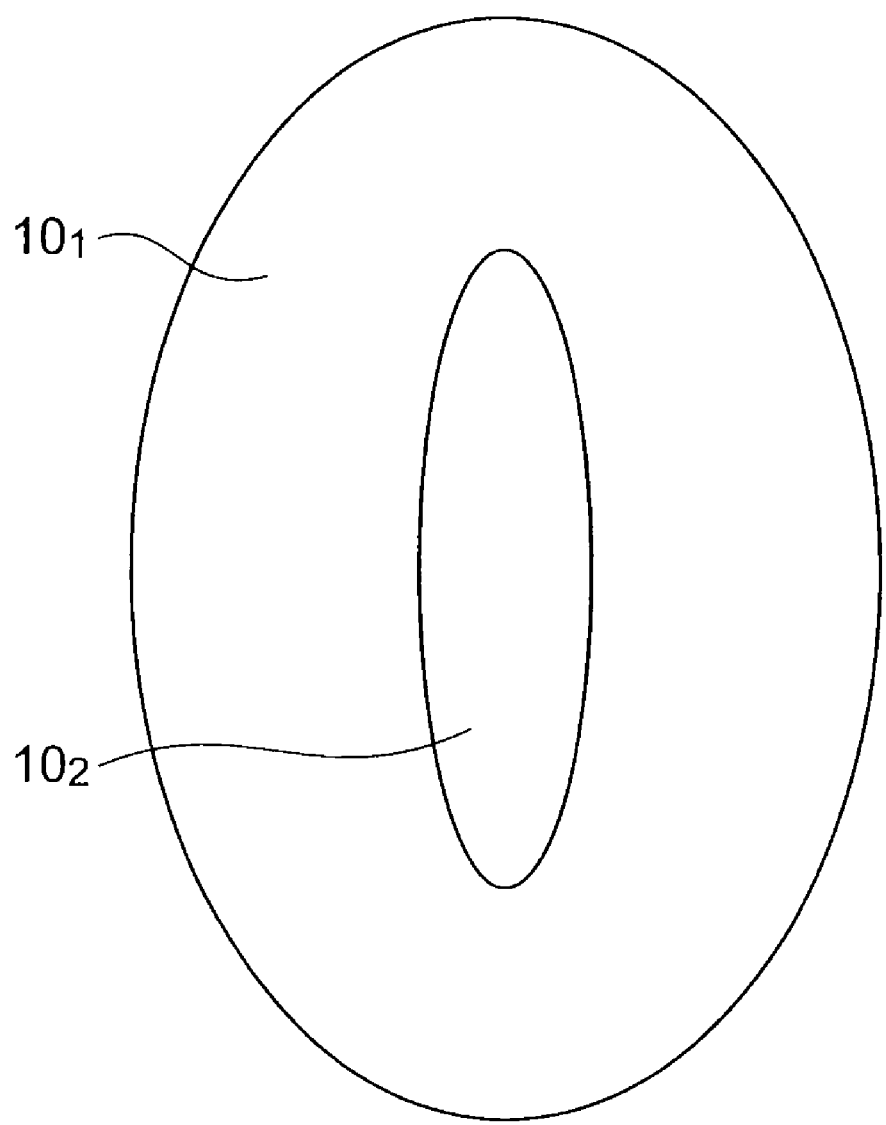
FIG. 21 is a plan view of the first and second magnetization free layers of the magnetoresistive element according to the sixth embodiment.

FIG. 21 is a plan view of the first magnetization free layer 10₁ and the second magnetization free layer 10₂ of this embodiment. The first magnetization free layer 10₁ is allowed to have such an aspect ratio as to induce shape anisotropy. Also, the second magnetization free layer 10₂ should preferably have an aspect ratio of 3 or more, so as to provide sufficient shape anisotropy. Further, the first magnetization free layer 10₁ and the second magnetization free layer 10₂ should be designed to have substantially the same magnetizing moment. In this embodiment, the magnetizing moment of the first magnetization free layer 10₁ is 1000 emu/cc, and the magnetizing moment of the second magnetization free layer 10₂ (including the magnetizing moment of the interfacial layer) is 800 emu/cc. Accordingly, the ratio is approximately 17:15. In this case, the first magnetization free layer 10₁ does not take an intermediate value or the like, and a stable spin reversal can be performed. Also, since the area ratio between the first magnetization free layer 10₁ and the second magnetization free layer 10₂ is 4.8, the current density required by the first tunnel barrier layer 8 is 1/4.8 of the current density in the case where the first magnetization free layer 10₁ and the second magnetization free layer 10₂ have the same film-plane areas. Thus, higher reliability is achieved.

In this embodiment, the first tunnel barrier layer 8 made of MgO has a film thickness of 0.8 nm, Ra of approximately $17.9\Omega/\mu m^2$, and an area of approximately $0.0127\ \mu m^2$. The second tunnel barrier layer 13 made of MgO has a film thickness of 0.6 nm, Ra of approximately $2.6\Omega/\mu m^2$, and an area of approximately $0.00236\ \mu m^2$. Accordingly, the resistance values of the first and second tunnel barrier layers 8 and 13 are $1409\Omega$ and $1101\Omega$, respectively. Thus, the resistance value ratio between the first and second tunnel barrier layers 8 and 13 is 1:0.79, which is within the range of 1:0.25 to 1:4.

Like the magnetoresistive element of the first embodiment, the magnetoresistive element of this embodiment has a tunnel barrier layer on either side of the magnetization free layer.

Accordingly, high-energy electrons can be injected to the magnetization free layer through the tunnel barrier layers in both positive and negative directions, and the reversed current caused at the time of a magnetization reversal can be further reduced.

Seventh Embodiment

Referring now to FIGS. 22A to 23C, a magnetoresistive element in accordance with a seventh embodiment of the present invention is described.

In the magnetoresistive element of this embodiment, the tolerance to thermal fluctuation of the magnetization free layer is obtained from a film having soft magnetic properties. In the fourth and fifth embodiments, the large perpendicular magnetic anisotropy characteristic of the material is utilized to maintain tolerance to thermal fluctuation in miniaturized devices. In a case where a soft magnetic material is used, the magnetic properties can be controlled by adjusting the shapes, and highly uniform devices that are not affected by variations in film quality can be produced. To obtain large magnetic anisotropy from a large film having soft magnetic properties, a large size that has a maximum volume and has a high aspect ratio (the ratio between the vertical length (the length in the direction perpendicular to the paper space) and the transverse length (the length in the horizontal direction of the paper space)) to utilize the shape anisotropy should preferably be maintained, and a stick-like shape should preferably be formed. In this embodiment, the magnetization free layer is shaped into a stick-like form by the following manufacturing method to produce a magnetoresistive element.

Figure 22A:
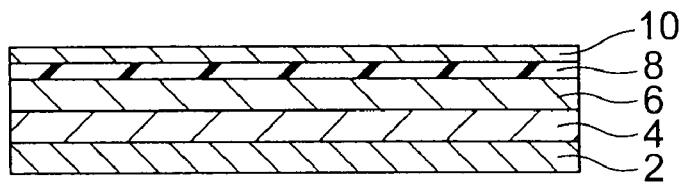
FIGS. 22A to 22D are cross-sectional views illustrating the procedures for manufacturing a magnetoresistive element according to a seventh embodiment.
Figure 22B:
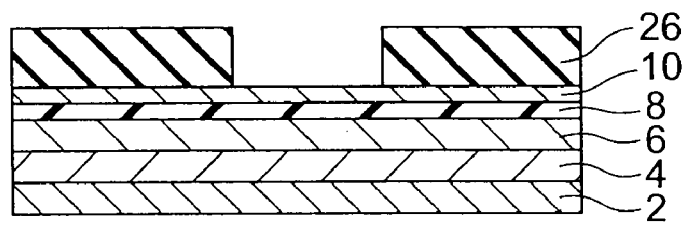

First, as shown in FIG. 22A, a selective transistor and the likes are formed on a substrate. The following films are then stacked in the following order: a 10-nm thick lower electrode 2 made of Ta; a 20-nm thick antiferromagnetic layer 4 made of PtMn; a magnetization pinned layer 6 having a stacked structure consisting of a 2-nm thick CoFe layer, a 0.6-nm thick Ru layer, and a 2-nm thick CoFe layer; a 0.7-nm thick first tunnel barrier layer 8 made of MgO; and a 1.5-nm thick first magnetization free layer 10 made of CoFe. A 30-nm thick protection film 26 made of SiN is then deposited, as shown in FIG. 22B, and the surface of the protection film 26 is shaped to have a groove-like portion of 30 nm×100 nm by a photo-lithography technique. Here, oxidation of the first free magnetization 10 made of CoFe and exposed as the base should be avoided in the resist removing procedure.

Figure 22C:
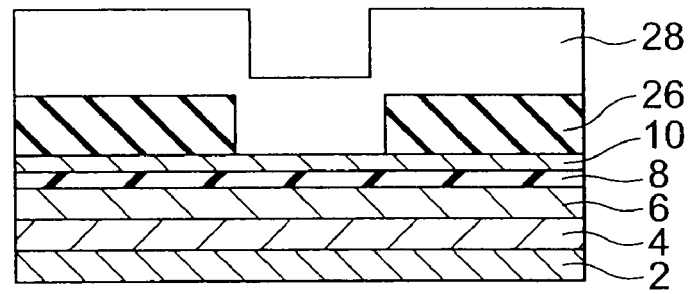
Figure 22D:
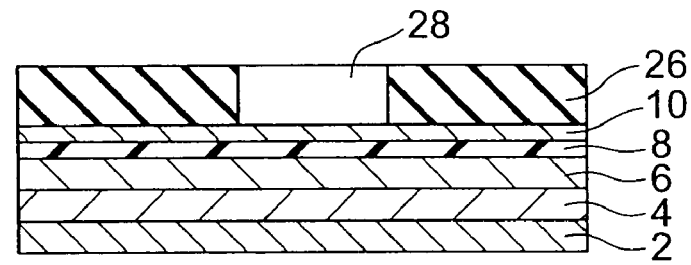

As shown in FIG. 22C, the groove is filled with NiFe by sputtering or the like, and, as shown in FIG. 22D, the NiFe is shaped into a stick-like form by CMP. Here, the film thickness of the NiFe film 28 shaped into a stick-like form is adjusted to 20 nm by CMP. This NiFe film 28 shaped into a stick-like form serves as the second magnetization free layer, and has a smaller width (the length in the "hard" magnetization direction (the horizontal direction of the paper space)) than the first magnetization free layer 10.

Figure 23A:
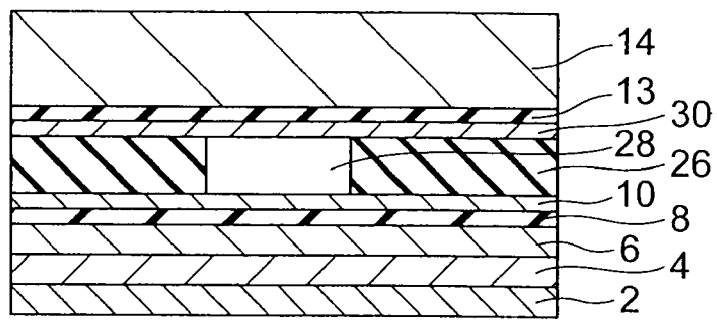
FIGS. 23A to 23C are cross-sectional views illustrating the procedures for manufacturing the magnetoresistive element according to the seventh embodiment.
Figure 23B:
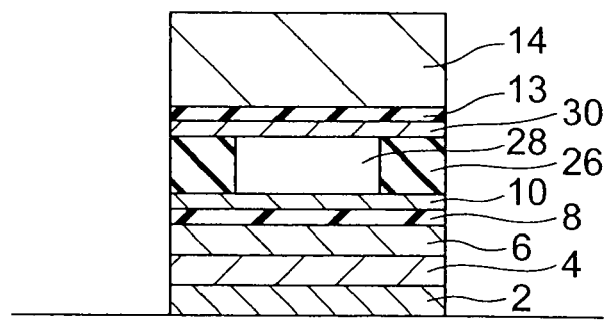

A 1.5-nm thick interfacial layer 30 made of CoFe, a 0.6-nm thick second tunnel barrier layer 13 made of MgO, and an 80-nm thick upper electrode 14 made of Ta are then deposited in this order, as shown in FIG. 23A. After that, as shown in FIG. 23B, the films from the upper electrode 14 to the lower electrode 2 are shaped into a predetermined form.

Figure 23C:
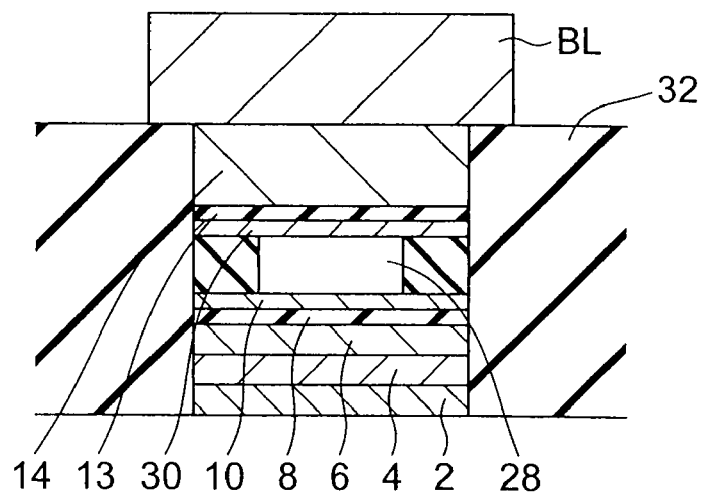

After an interlayer insulating film 32 made of $SiO_2$ is formed, as shown in FIG. 23C, the interlayer insulating film 32 is flattened by CMP, so as to expose the upper face of the upper electrode 14. A 10-nm thick Ti layer, a 400-nm thick Al layer, a 10-nm thick Ti layer, and a 10-nm thick TiN layer are then deposited in this order. Those layers are then shaped into a predetermined form, so as to produce a bit line BL and to complete a magnetoresistive element.

Like the magnetoresistive element of the first embodiment, the magnetoresistive element of this embodiment has a tunnel barrier layer on either side of the magnetization free layer. Accordingly, high-energy electrons can be injected to the magnetization free layer through the tunnel barrier layers in both positive and negative directions, and the reversed current caused at the time of a magnetization reversal can be further reduced.

It is of course possible to use any of the magnetoresistive elements of the fourth to seventh embodiments as a magnetoresistive element in any of the magnetic memories of the second and third embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method for manufacturing a magnetoresistive element comprising:
   forming a lower electrode film on a substrate;
   forming a stacked film on the lower electrode film, the stacked film comprising a first magnetic layer to be a magnetization fixed layer having a fixed magnetization direction, a tunnel barrier layer, and a second magnetic layer to be a magnetization free layer having a changeable magnetization direction;
   forming a first upper electrode film on the stacked film;
   patterning the first upper electrode film to form a first upper electrode;
   patterning the stacked film with the first upper electrode serving as a mask;
   forming an insulating film to cover the first upper electrode;
   exposing an upper face of the first upper electrode;
   forming a second upper electrode film to cover the first upper electrode;
   patterning the second upper electrode film to form a second upper electrode; and
   patterning the lower electrode film to form a lower electrode with the second upper electrode serving as a mask after forming the first and second upper electrodes.

2. The method according to claim 1, wherein exposing of the upper face of the first upper electrode comprises polishing the insulating film to expose the upper face of the first upper electrode.

3. The method according to claim 1, wherein the second upper electrode has a plane area larger than that of the first upper electrode.

4. The method according to claim 1, wherein the tunnel barrier layer is formed of MgO.

5. The method according to claim 1, wherein patterning of the stacked film comprises patterning the second magnetic layer.

* * * * *